(12) United States Patent
Yoshihara et al.

(10) Patent No.: US 6,555,901 B1
(45) Date of Patent: Apr. 29, 2003

(54) SEMICONDUCTOR DEVICE INCLUDING EUTECTIC BONDING PORTION AND METHOD FOR MANUFACTURING THE SAME

(75) Inventors: Shinji Yoshihara, Nagoya (JP); Fumio Ohara, Okazaki (JP); Masao Nagakubo, Nishikamo-gun (JP)

(73) Assignee: DENSO Corporation, Kariya (JP)

( * ) Notice: Subject to any disclaimer, the term of this patent is extended or adjusted under 35 U.S.C. 154(b) by 709 days.

(21) Appl. No.: 08/943,146

(22) Filed: Oct. 3, 1997

(30) Foreign Application Priority Data

Oct. 4, 1996 (JP) ............................................. 8-264642

(51) Int. Cl.⁷ ............................................. H01L 23/06
(52) U.S. Cl. ..................................................... 257/684
(58) Field of Search ................................ 257/734, 684, 257/777; 438/51, 455, 456

(56) References Cited

U.S. PATENT DOCUMENTS 4,701,424 A * 10/1987 Mikkor ...................... 437/209
4,921,564 A    5/1990  Moore
5,006,487 A    4/1991  Stokes
5,310,450 A    5/1994  Offenberg et al.
5,435,876 A    7/1995  Alfaro et al.
5,461,916 A   10/1995  Fujii et al.
5,597,767 A    1/1997  Mignardi et al.
5,668,033 A *  9/1997  Ohara et al. ................ 438/133

\* cited by examiner

Primary Examiner—Douglas A. Wille
Assistant Examiner—M. Brunson
(74) Attorney, Agent, or Firm—Harness, Dickey & Pierce, PLC

(57) ABSTRACT

A sensing element is formed on a silicon (Si) substrate and covered with a cap. The cap has a leg portion having a titanium layer and a gold layer formed in that order on the lower surface thereof. The silicon substrate has an Si bonding frame at a position corresponding to the leg portion. When bonding the Si bonding frame of the silicon substrate and the leg portion of the cap, the titanium layer deoxidizes a naturally oxidized silicon layer formed on the Si bonding frame, whereby the silicon substrate and the cap can be uniformly bonded together with an Au/Si eutectic portion interposed therebetween. In this case, the Au/Si eutectic portion includes a titanium oxide accompanying the deoxidization of the naturally oxidized silicon layer.

7 Claims, 22 Drawing Sheets

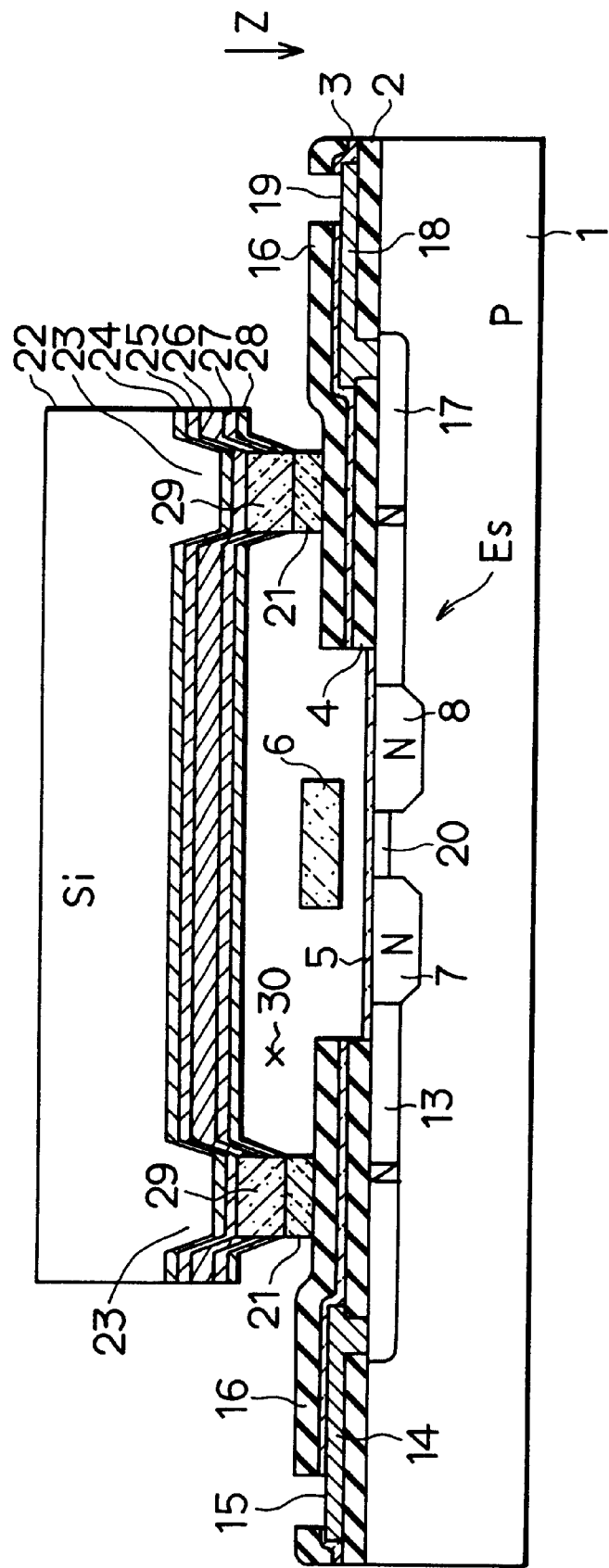

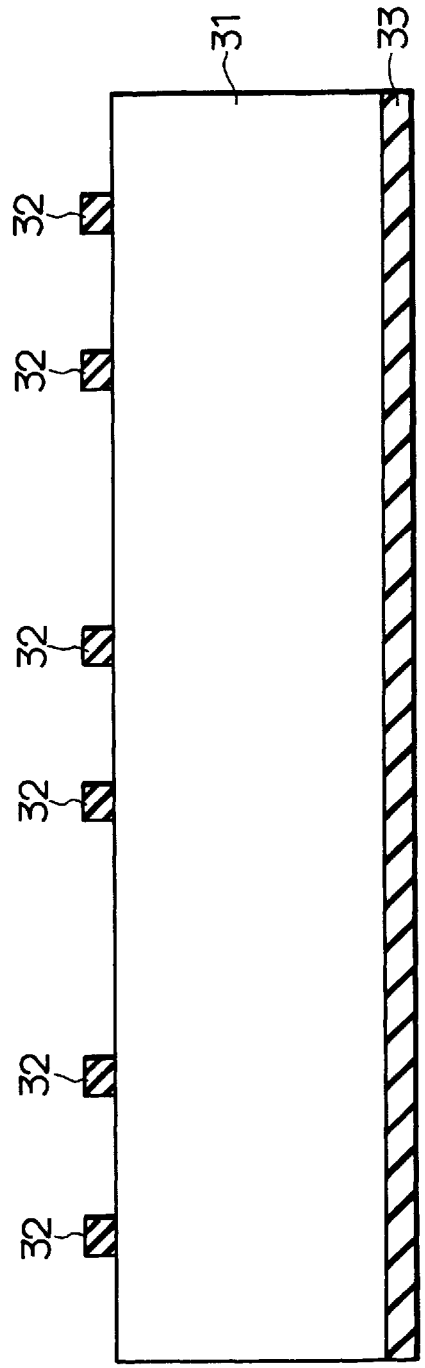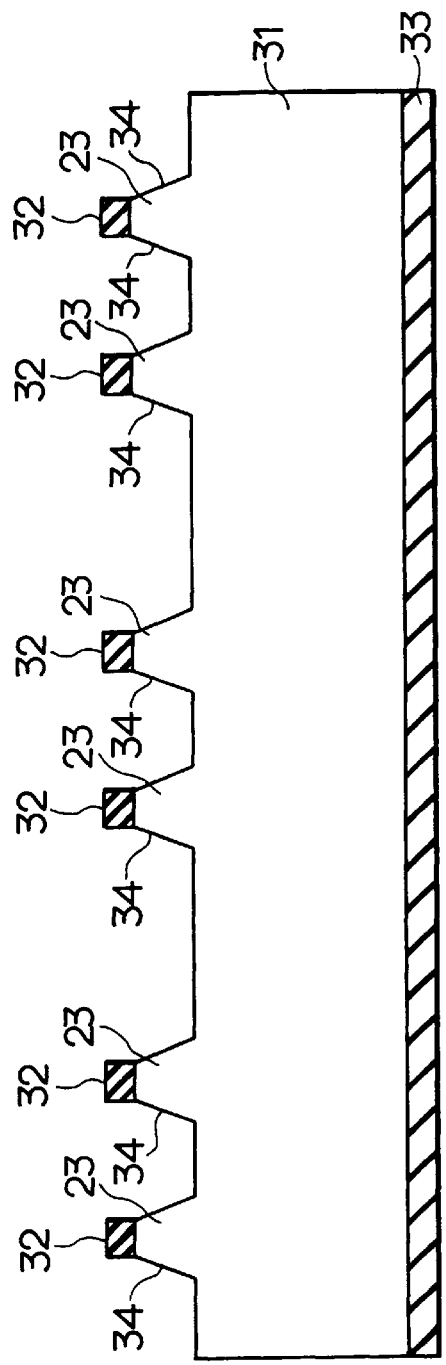

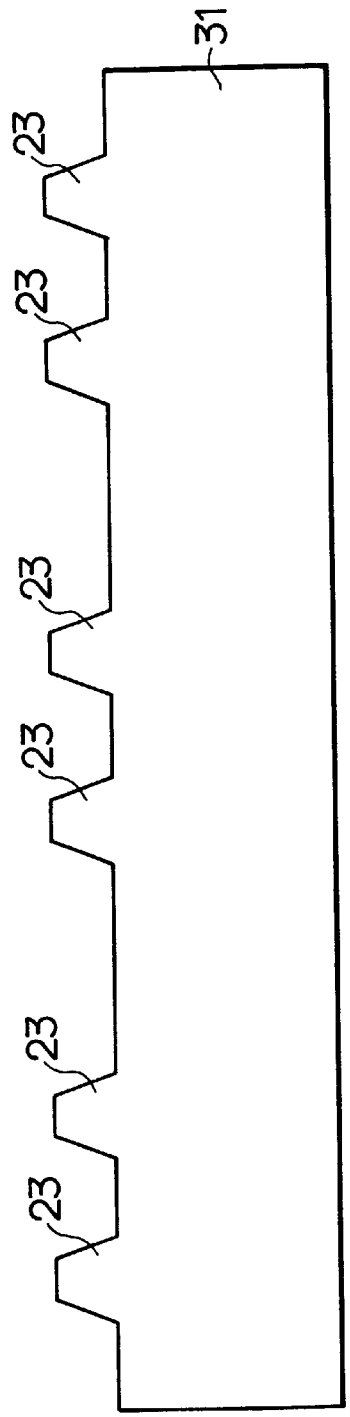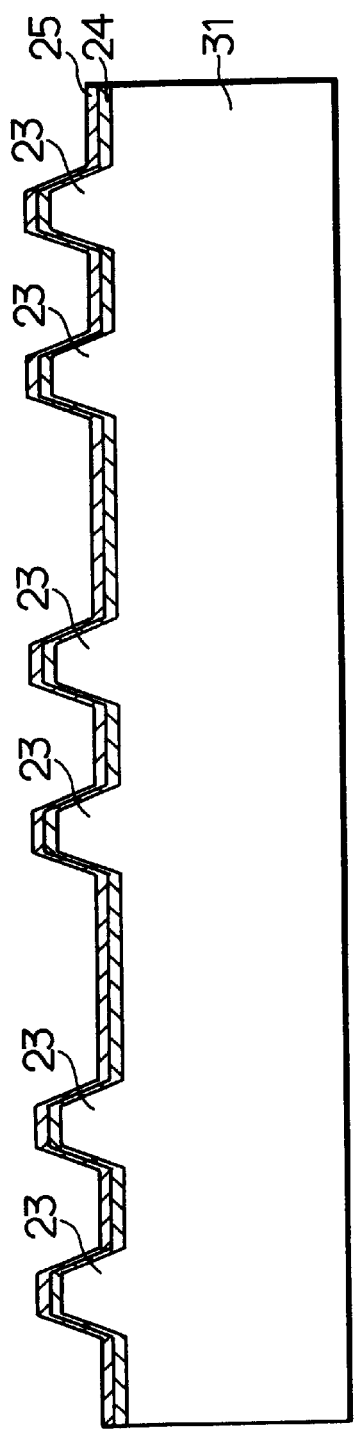

SEMICONDUCTOR DEVICE INCLUDING EUTECTIC BONDING PORTION AND METHOD FOR MANUFACTURING THE SAME

CROSS REFERENCE TO RELATED APPLICATION

This application is based upon and claims the benefit of priority of the prior Japanese Patent Application No. 8-264642 filed on Oct. 4, 1996, the contents of which are incorporated herein by reference.

BACKGROUND OF THE INVENTION

1. Field of the Invention

The present invention relates to a semiconductor device including an eutectic bonding portion and a method for manufacturing the same. For example, the present invention is favorably applied to a semiconductor device having a protection cap for covering a functional element therein.

2. Description of Related Art

Conventionally, a semiconductor acceleration sensor, a yaw rate sensor, or the like generally has a movable portion (vibrating portion) on its silicon chip. The movable portion is displaced in accordance with a physical quantity such as an acceleration, and an electric signal corresponding to the physical quantity is determined by converting the displacement of the movable portion to the electric signal. Also, in such a semiconductor device, as disclosed in JP-A-5-326702, a cap covers the movable portion in order to protect the movable portion. In this case, to improve the measurement sensitivity, stability of characteristics, avoidance of air damping, etc., it is preferable that an atmosphere around the movable portions is an inert gas atmosphere, a deoxidation gas atmosphere, or a vacuum atmosphere in some cases. Because of this, there is a need to seal the movable portion in the above-mentioned atmosphere, and therefore a cap for covering the movable portion without causing leakage therefrom is required.

To comply with this need, JP-A-5-326702 discloses a cap for covering not only an element having a movable portion but a chip carrying the element. However, this structure is not suitable for a device having a size which is to be miniaturized. Further, JP-A-4-304679 proposes a technology in which an element is sealed by a thin film formed during a wafer process. In this case, because the thin film serves as a cap, several disadvantages arise such that the mechanical strength thereof is low, the shape of the element is limited, there is no flexibility, and the like. To improve the mechanical strength thereof, a cap made of a bulk can be disposed on the chip in place of the cap made of a thin film. In this case, however, there is a need to invent a bonding method considering a quantity production property.

As a bonding method, anode bonding, direct bonding, and eutectic bonding methods are well known. In the anode bonding method, a high voltage is applied to the chip. If the chip has a circuit element, a withstand voltage of which is not so high, the circuit element is liable to be broken. To avoid this problem, the circuit element may be disposed on another chip other than the chip to which the cap is bonded. That is, the anode bonding method cannot be applied to the chip having the circuit element, and therefore there is no flexibility. In addition, gas is liable to be generated in the anode bonding process thereby adversely affecting sensing properties. Especially, in a vacuum sealing structure, the gas deteriorates the degree of vacuum. In the direct bonding method, there is a necessity to obtain adhesion at an atomic level. Therefore, this bonding method is generally applied to very limited cases. Further, this bonding method requires flat surfaces to be bonded and the application of high pressure. In view of the above, the direct bonding method is also difficult to be applied for the cap to be bonded to the chip.

In the eutectic bonding method that is a long-employed bonding method, the bonding portion is liquidized so that it does not require high pressure applied thereto.

Specifically, in a case where gold (Au) and silicon (Si) is bonded to each other in the eutectic bonding method (Au/Si eutectic bonding method), its bonding temperature is comparatively low and there is consistency between the bonding method and the other processes. Therefore, the eutectic bonding method is considered to be the most effective method for the bonding of the cap.

However, this bonding method has a disadvantage of being liable to produce voids in the bonding portion which may cause leakage therefrom. Now, there is no report about a technique that a void-less bonding is realized with a high yield in the eutectic bonding method. In addition, in the Au/Si eutectic bonding method, because silicon is an extremely active material, a naturally oxidized layer is formed on the surface of silicon. This oxidized layer disturbs an eutectic region to be formed on an entire interface between silicon and gold layers thereby resulting in large variations in bonding strength.

SUMMARY OF THE INVENTION

In view of the above-mentioned problems, an object of the present invention is to provide a semiconductor device including a Au/Si eutectic bonding portion which can solve the problems caused by a naturally oxidized layer of silicon and a method for manufacturing the same.

A semiconductor device according to the present invention includes first and second substrates bonded together by an eutectic portion of silicon and gold (Au/Si eutectic portion) containing an oxide of metal that has deoxidized silicon oxide.

In a method for manufacturing a semiconductor device according to the present invention, firstly, a first wafer having a silicon portion on a surface thereof and a second wafer having a gold layer and a metallic layer formed on a surface thereof are prepared. The metallic layer is made of metal having a deoxidizing property relative to silicon oxide. Then, in a state where the first and second wafers contacts each other, the first and second wafers are heated up to a temperature equal to or higher than an Au/Si eutectic temperature, thereby bonding to each other. Then, the first and second wafers are cut into individual semiconductor devices.

During the heating of the first and second wafers, metal of the metallic layer deoxidizes a naturally oxidized layer formed on a surface of the silicon portion of the first wafer. As a result, because the gold layer and the silicon portion can be contacted at an entire interface between the first and second wafers, an Au/Si eutectic portion is formed at all portion between the first and second wafers. Accordingly, variations of bonding strength between the first and second wafers are reduced, so that uniform and stable bonding can be realized. The metallic layer may be made of one material selected from titanium, aluminum, tantalum, zirconium, and niobium. The thickness of the metallic layer is preferably in a range of 10 nm to 100 nm. A protection layer made of gold may be formed on the metallic layer to prevent oxidization of the metallic layer. However, if the heating of the first and second wafers is performed in an atmosphere of vacuum, an inert gas, or deoxidization agent, the oxidization of the metallic layer can be prevented. In such a case, there is no need to form the protection layer on the metallic layer. To promote an eutectic reaction during the heating of the first and second wafers, it is effective to roughen a surface of the silicon portion in advance of the bonding of the first and second wafers.

BRIEF DESCRIPTION OF THE DRAWINGS

Other objects and features of the present invention will become more readily apparent from a better understanding of the preferred embodiments described below with reference to the following drawings.

FIG. 3 is a cross-sectional view taken along a III—III line in FIG. 1, showing the semiconductor device;

FIGS. 4 through 22 are cross-sectional views showing manufacturing steps for manufacturing the semiconductor device shown in FIGS. 1 to 3;

DETAILED DESCRIPTION OF THE PREFERRED EMBODIMENT

A preferred embodiment with respect to a semiconductor acceleration sensor in which the present invention is embodied will now be explained with reference to the drawings.

Figure 1:
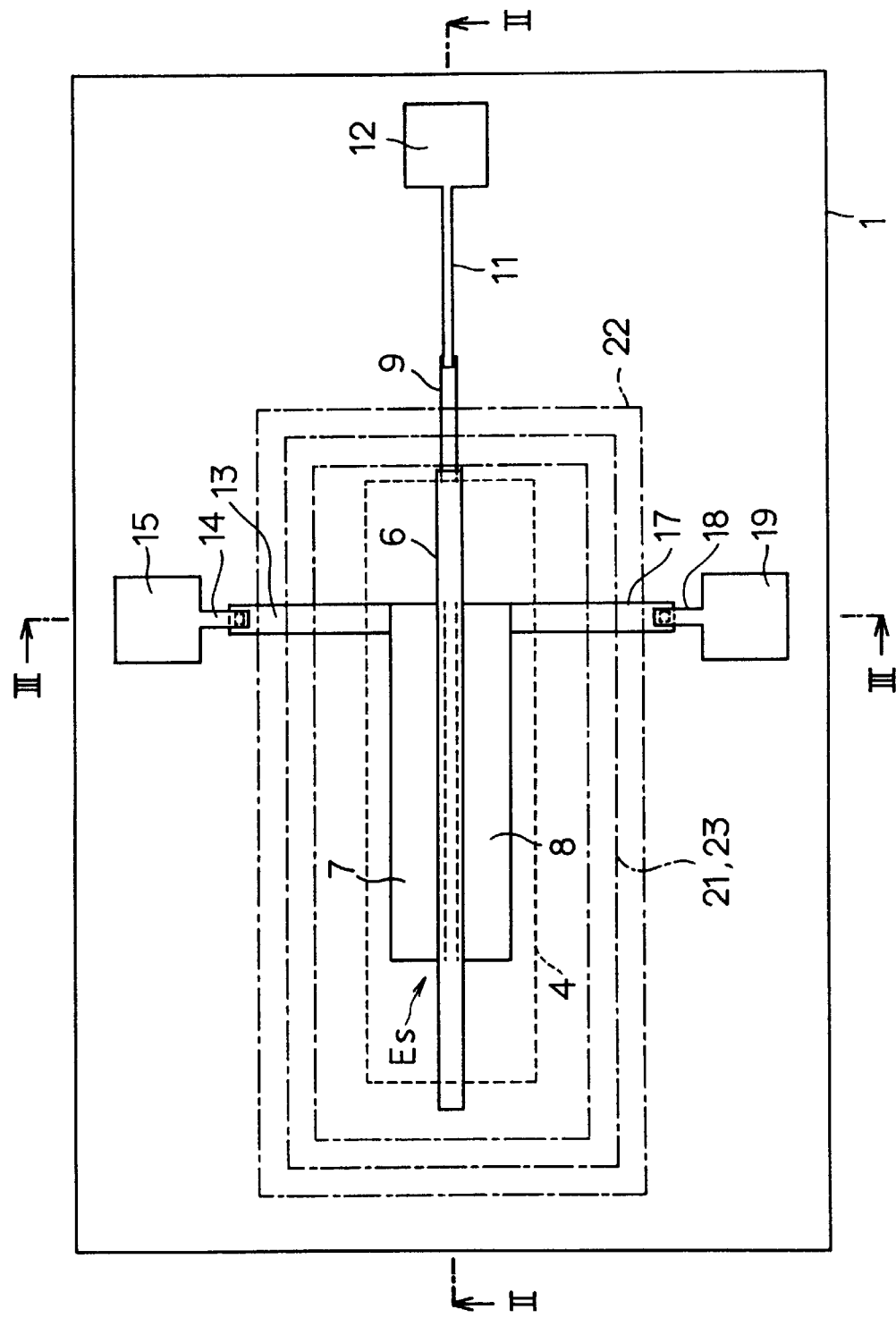
FIG. 1 is a plan view showing a semiconductor device in a preferred embodiment according to the present invention.
Figure 2:
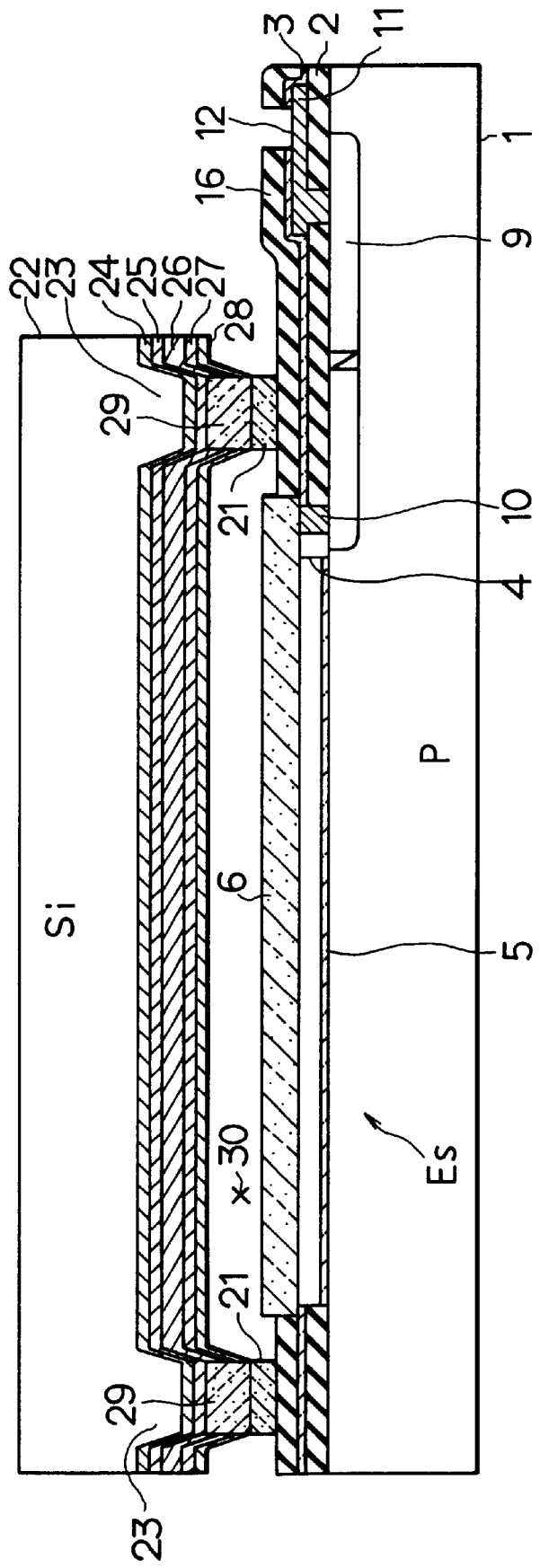
FIG. 2 is a cross-sectional view taken along a II—II line in FIG. 1, showing the semiconductor device.

A movable gate metal oxide semiconductor (MOS) transistor type acceleration sensor according to this embodiment shown in FIGS. 1 to 3 has a P-type silicon substrate 1 serving as a first substrate on which an element is formed. Specifically, a field oxide layer 2 and a silicon nitride layer 3 are formed on the substrate 1 except a rectangular region 4 (refer to FIG. 1) in that order. On the rectangular region 4 of the substrate 1, a gate insulation layer 5 is formed. Further, a movable gate electrode 6 (vibrating portion) having bridged beam structure is disposed on the silicon nitride layer 3 in such a manner that this gate electrode 6 is bridged over the region 4. The movable gate electrode 6 consists of a polysilicon layer and linearly extends to form a strip. The P-type silicon substrate 1 and the movable gate electrode 6 are insulated from each other by the field oxide layer 2 and the silicon nitride layer 3.

As illustrated in FIG. 3, a fixed source electrode 7 and a fixed drain electrode 8 that respectively consist of impurity diffusion layers are formed in the substrate 1 on both sides of the movable gate electrode 6. Each of these electrodes 7 and 8 is one formed by ion implantation or the like of N-type impurities into the P-type silicon substrate 1.

As illustrated in FIGS. 1 and 2, an N-type impurity diffusion region 9 extende in the P-type silicon substrate 1. The N-type impurity diffusion region 9 is electrically connected to the movable gate electrode 6 through an aluminum portion 10 and is also electrically connected to an aluminum wiring 11. The other end of the aluminum wiring 11 is exposed from the silicon nitride layer 3 and a silicon oxide layer 16 disposed on the silicon nitride layer 3 and serves as an aluminum pad (electrode pad) 12. Further, as illustrated in FIG. 3, an N-type impurity diffusion region 13 is extended in the P-type silicon substrate 1 to be electrically connected to the fixed source electrode 7 and to an aluminum wiring 14. The other end of the aluminum wiring 14 is exposed from the silicon nitride layer 3 and the silicon oxide layer 16 and serves as an aluminum pad (electrode pad) 15. Further, an N-type impurity diffusion region 17 is extended in the P-type silicon substrate 1 to be electrically connected to the fixed drain electrode 8 and to an aluminum wiring 18. The other end of the aluminum wiring 18 is exposed from the silicon nitride layer 3 and the silicon oxide layer 16 and serves as an aluminum pad (electrode pad) 19.

In addition, a silicon nitride layer (not shown) serving as a final protective layer is formed on the silicon oxide layer 16 over a region except for the movable gate electrode 6. The aluminum pads 12, 15, and 19 are electrically connected to an external circuit through bonding wires.

As illustrated in FIG. 3, an inversion layer 20 is formed between the fixed source electrode 7 and the fixed drain electrode 8 in the P-type silicon substrate 1. This inversion layer 20 is generated through application of a voltage between the silicon substrate 1 and the movable gate electrode (bridged beam electrode) 6.

The mechanical strength of the thus constructed acceleration sensor is small because it includes the movable gate electrode 6 having the bridged beam structure. When an acceleration is detected, a voltage is applied between the movable gate electrode 6 and the silicon substrate 1 to produce the inversion layer 20. Accordingly, an electric current flows between the fixed source electrode 7 and the fixed drain electrode 8. When the acceleration sensor is subjected to acceleration whereby the movable gate electrode 6 changes in a direction perpendicular to the surface of the substrate 1, indicated by an arrow Z in FIG. 3, the carrier concentration in the inversion layer 20 increases due to a change in electric field intensity, with the result that the current (drain current) increases. In this way, in the present acceleration sensor, a sensing element (movable gate MOS transistor) Es serving as a functional element is formed on the surface of the silicon substrate 1 to enable the detection of the acceleration based on an increase or decease in the quantity of the current.

On the silicon oxide layer 16, a bonding frame (hereinbelow referred to as an Si bonding frame) 21 consisting of a polysilicon layer is formed on the periphery of the region where the sensing element Es is formed. The Si bonding frame 21 is a strip with a annular shape (More specifically, a rectangular annular shape). The aluminum pads (electrode pads) 12, 15, and 19 are provided on the outer periphery of the Si bonding frame 21.

A cap 22 serving as a second substrate for protecting the movable gate electrode 6 having a low mechanical strength consists of a square-shaped silicon substrate, and an annular leg portion 23 shown in FIGS. 2 and 3 is provided on the under surface of the cap 22. The leg portion 23 is formed by locally etching the silicon substrate. A titanium (Ti) thin layer 24, a gold (Au) thin layer 25, a gold plating thin layer 26, a titanium thin layer 27, and a gold thin layer 28 are laminated on the under surface of the cap 22 in that order. More specifically, the gold plating layer 26 for forming an Au/Si eutectic bonding portion is provided on the under surface of the cap 22. The surface of the gold plating layer 26 is covered with the titanium layer 27 having a deoxidization property relative to the silicon oxide layer, and the surface of the titanium layer 27 is covered with the gold layer 28 for protecting the titanium layer 27 from being oxidized. Further, the titanium layer 24 and the gold layer 25 that serves as a plating substrate intervene between the gold plating layer 26 and the cap 22. The thickness of the gold plating layer 26 is preferably 3.5 μm, and the thickness of each of the titanium layer 24 and the gold layer 25 is preferably 1000 Å. The thickness of the titanium layer 27 is preferably in a range of 50 Å to 800 Å, and the thickness of the gold layer 28 is preferably 200Å.

Figure 26:
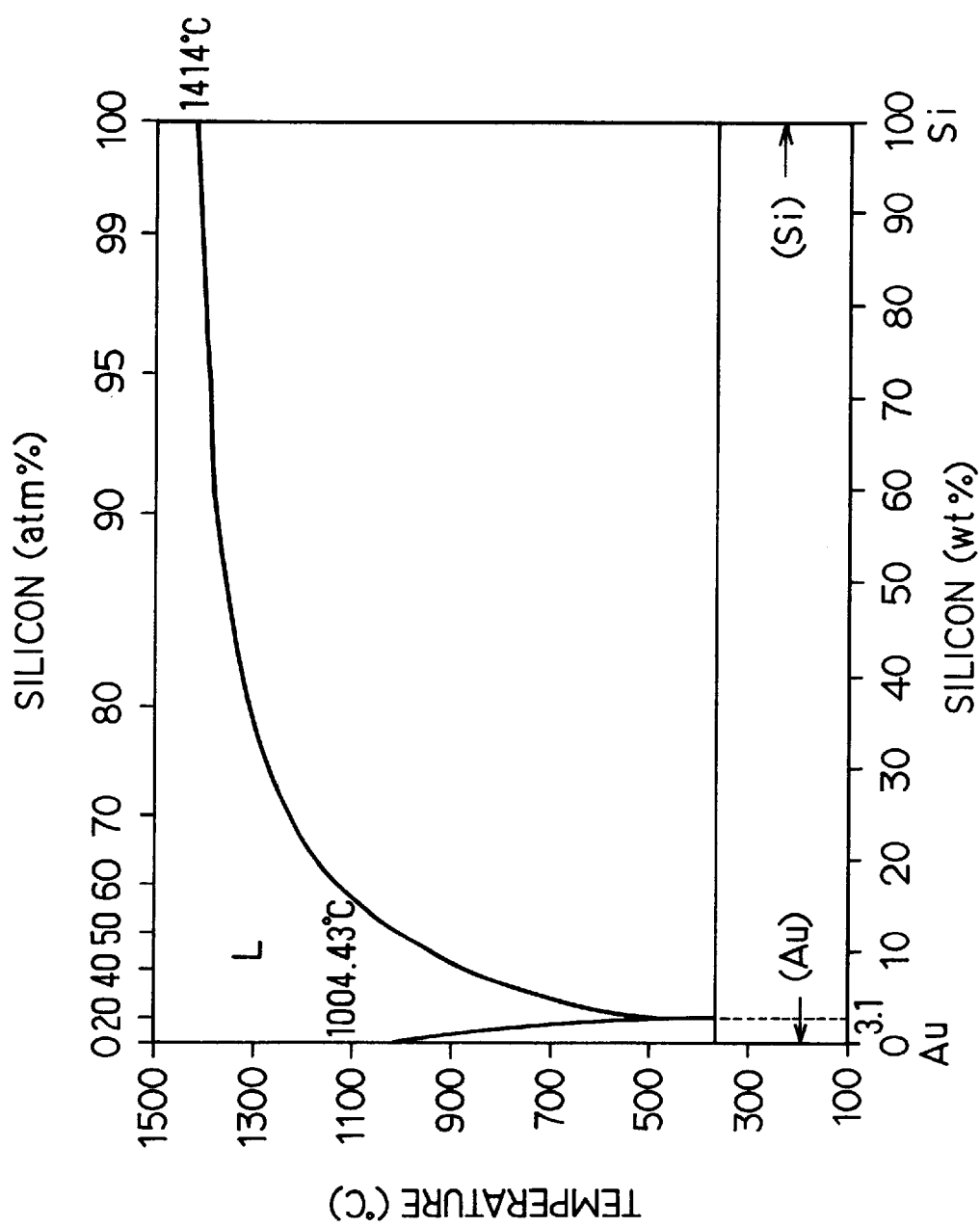
FIG. 26 is a phase diagram of a Au/Si composition.

A tip surface (bottom surface) of the leg portion 23 on a cap side and the Si bonding frame 21 on a P-type silicon substrate side are bonded to each other through an Au/Si eutectic portion 29. More specifically, the Si bonding frame (polysilicon layer) 21 and the gold layer 26 are heated up to a temperature higher than an Au/Si eutectic temperature of 363° C. to cause an eutectic reaction therebetween, whereby the Si bonding frame 21 and the gold layer 26 are bonded to each other through the Au/Si eutectic portion 29. The Au/Si eutectic portion 29 is formed on the entire tip surface (bottom surface) of the leg portion 23 without causing any voids therein. Namely, a void-less bonding is realized. In more detail, titanium (metal capable of deoxidizing silicon oxide) from the titanium layer 27 deoxidizes a naturally oxidized layer formed on the surface of the Si bonding frame 21 to produce titanium oxide. This titanium oxide exists in the Au/Si eutectic portion 29. As understood by FIG. 26 illustrating a phase diagram of Au-Si, the composite ratio of silicon in the Au/Si eutectic portion 29 is approximately 3.1 wt %.

As mentioned above, by bonding the cap 22 to the Si bonding frame 21, a structure is provided wherein the sensing element Es is sealed within the space 30 between the cap 22 and the surface of the silicon substrate 1. Specifically, the cap 22 is disposed to define the space 30 with respect to the silicon substrate 1 on which the sensing element Es is formed thereby forming the structure in which the sensing element Es is sealed within the space 30. The cap 22 protects the movable gate electrode 6 from hydraulic pressure and a stream of water in a dicing cut process described later. The cap 22 further protects the sensing element Es to be kept in a hermetically sealed state.

Next, steps for forming a sealed structure using the cap 22 will be explained referring to FIGS. 4 to 17. In consideration of a quantity production property, chips serving as respective caps are not separately bonded to respective sensing chips, but simultaneously bonded to the sensing chips.

Firstly, as illustrated in FIG. 4, a silicon wafer which form second substrates serving as the cap (hereinafter referred to as a cap forming wafer) 31 is prepared. The cap forming wafer 31 has the same size as a sensing element forming the silicon wafer on which sensing elements Es are formed. Then, a thermal oxidization layer 32 is formed on the main surface of the cap forming wafer 31 to have a thickness of 5000 Å, and simultaneously, a thermal oxidization layer 33 is formed on the back surface of the cap forming wafer 31 to have a thickness of 5000 Å as well. The thermal oxidization layer 32 formed on the main surface of the cap forming wafer 31 is patterned into a specific shape by a photo-etching technique.

Then, as illustrated in FIG. 5, the cap forming wafer 31 is etched to have recesses 34 thereon by using the thermal oxidization layer 32 as a patterning mask. In detail, the cap forming wafer 31 has a (100) crystal faces on the surface thereof, and an anisotropic etching process using an alkaline solution as an etching solution is performed on the wafer 31 to form the recesses 34. As a result, the leg portions 23 (protrusions) are formed between the recesses 34 on the main surface of the cap forming wafer 31. The positions where the leg portions 23 are formed correspond to the patterns of the Si bonding frames 21. When the cap forming wafer 31 is cut in the subsequent dicing cut process, the leg portions 23 secure a space necessary for preventing the contact between the dicing blade and the sensing element forming silicon wafer 35.

Further, as illustrated in FIG. 6, the thermal oxidization layer 32 which has served as the mask and the thermal oxidization layer 33 on the back surface of the cap forming wafer are removed by using hydrofluoric acid (HF) or the like. Subsequently, as illustrated in FIG. 7, the titanium layer 24 and the gold layer 25 are successively deposited on the main surface of the cap forming wafer 31 under a vacuum atmosphere by an evaporation method or a sputtering method. Each thickness of the titanium layer 24 and the gold layer 25 is 1000 Å. The titanium layer 24 is formed to improve the adhesion between the gold layer 25 and the cap forming wafer 31. The gold layer 25 is used as seeds for forming the gold plating layer 26 thereon in the next step, however, it may be omitted.

Figure 8:
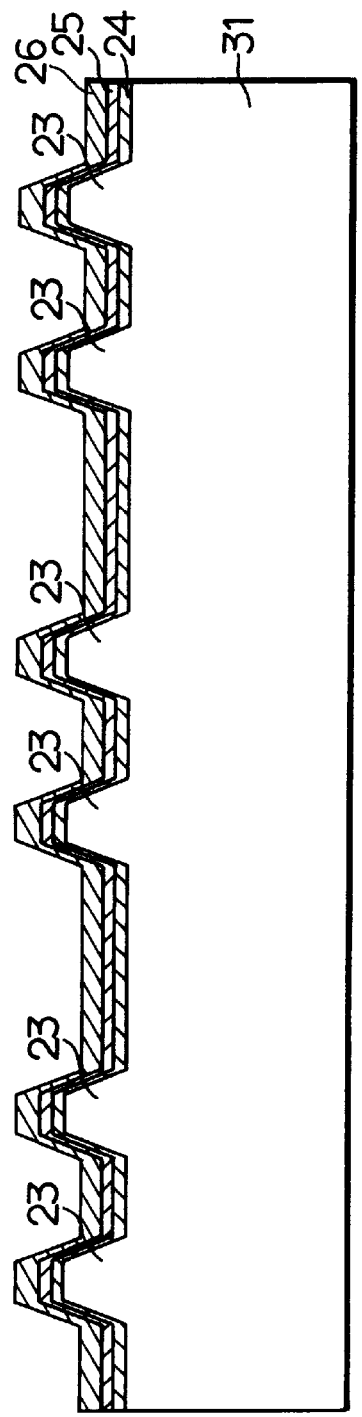
Figure 9:
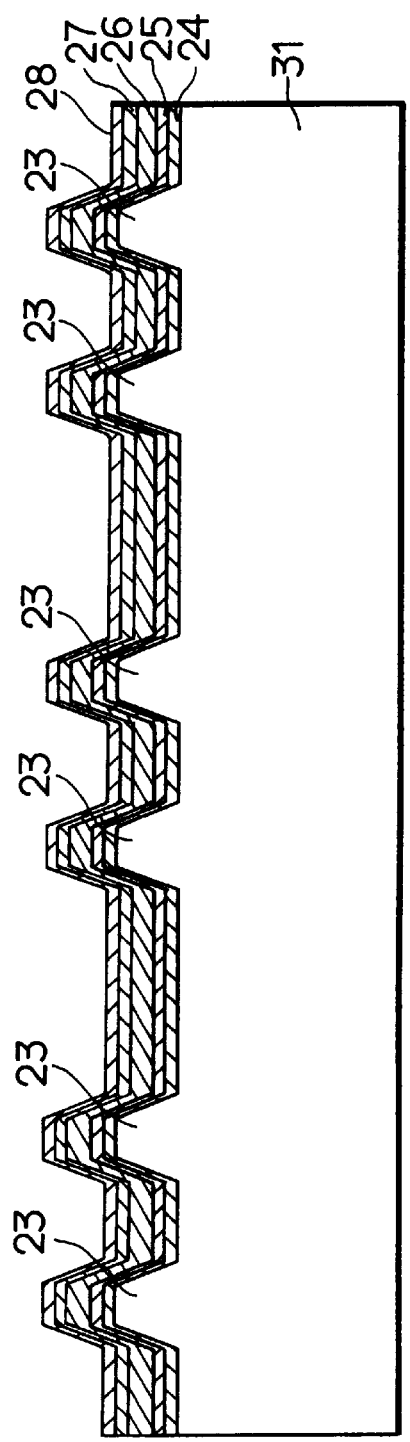

Then, as illustrated in FIG. 8, the gold plating layer 26 is plated on the entire surface of the gold layer 25 by an electrolytic plating method. The thickness of the gold plating layer 26 is preferably 3.5 μm. Further, as illustrated in FIG. 9, the titanium layer 27 necessary for realizing the void-less bonding and the gold layer 28 for protecting the titanium layer 27 from the oxidization are successively deposited on the gold plating layer 26 in a vacuum atmosphere. The thickness of the titanium layer 27 is preferably in a range of 50 Å to 800 Å. If the titanium layer 27 has a thickness thicker than 1000 Å, a great deal of titanium silicide is produced in the titanium layer 27 in addition to titanium oxide during the bonding process, thereby deteriorating bonding strength. The thickness of the gold layer 28 is preferable to be 200 Å in view of the diffusion of titanium (Ti) to the surface of the silicon substrate through the gold layer 28.

Figure 10:
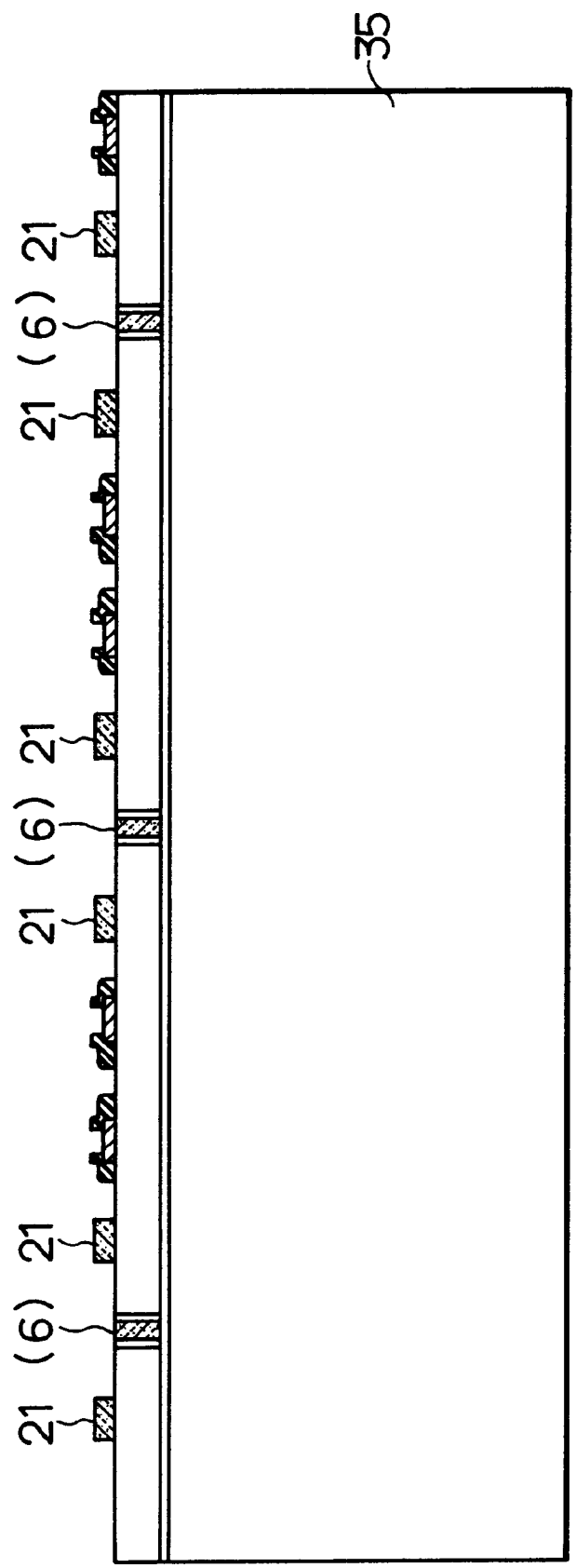
Figure 11:
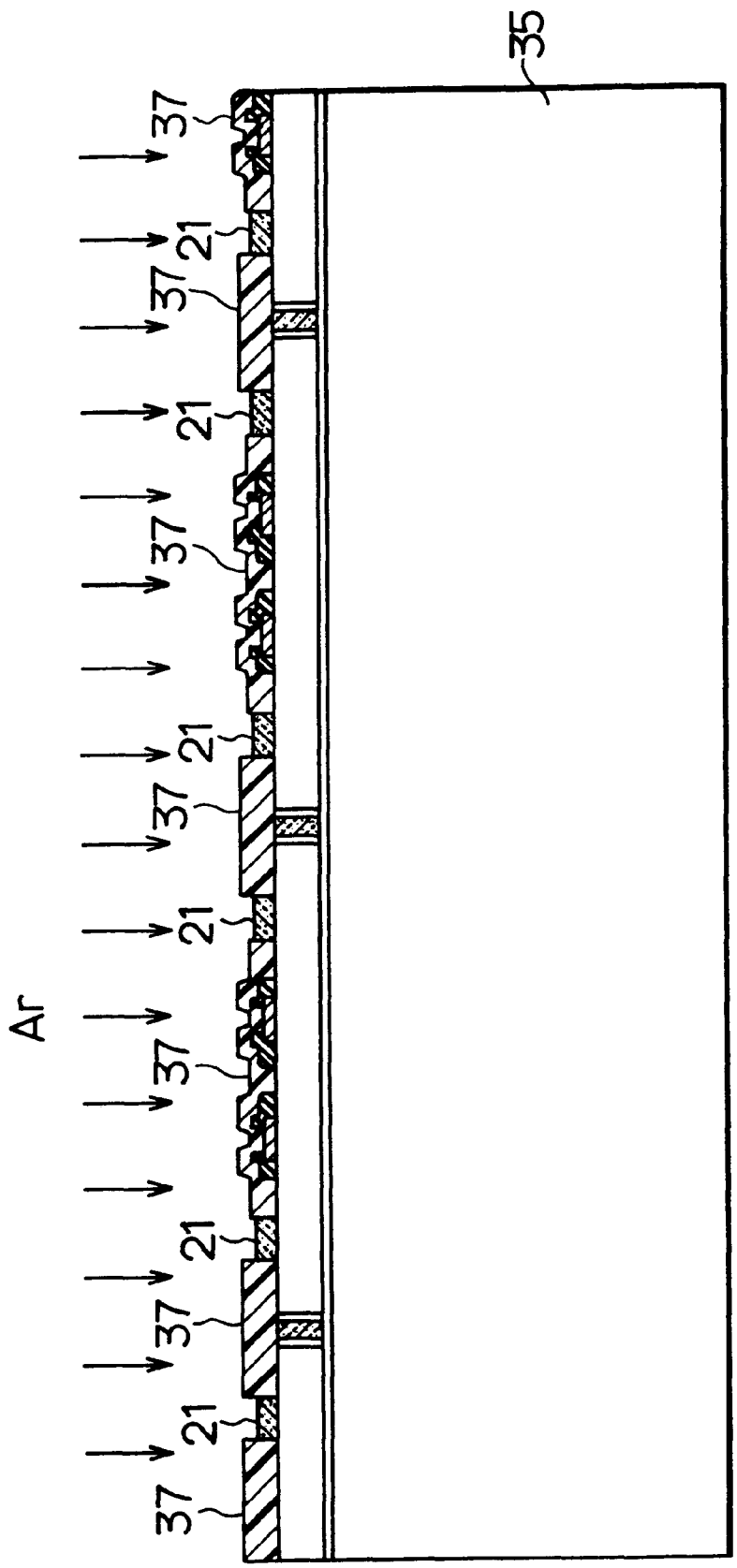

On the other hand, as illustrated in FIG. 10, a silicon wafer that serves as a first substrate for forming the sensing element Es thereon (hereinbelow referred to as an element forming wafer) 35, which has referred to as the sensing element forming wafer above, is prepared. On the element forming wafer 35, a layer which becomes the movable gate electrode 6 having bridged beam structure and the Si bonding frame 21 made of polysilicon are formed. Then, the surface of the Si bonding frame 21 (bonding portion of the element forming wafer) is roughened. Specifically, argon (Ar) is irradiated on the Si bonding frame 21 to etch the surface thereof. More specifically, as illustrated in FIG. 11, a resist 37 is coated on the main surface of the element forming wafer 35 so that only the Si bonding frame 21 (bonding region) is exposed, and then, the sputtering of Ar is performed to the surface of the Si bonding frame 21. Accordingly, the surface area of the Si bonding frame 21 (silicon portion) is increased so that the eutectic reaction thereon is promoted.

Figure 12:
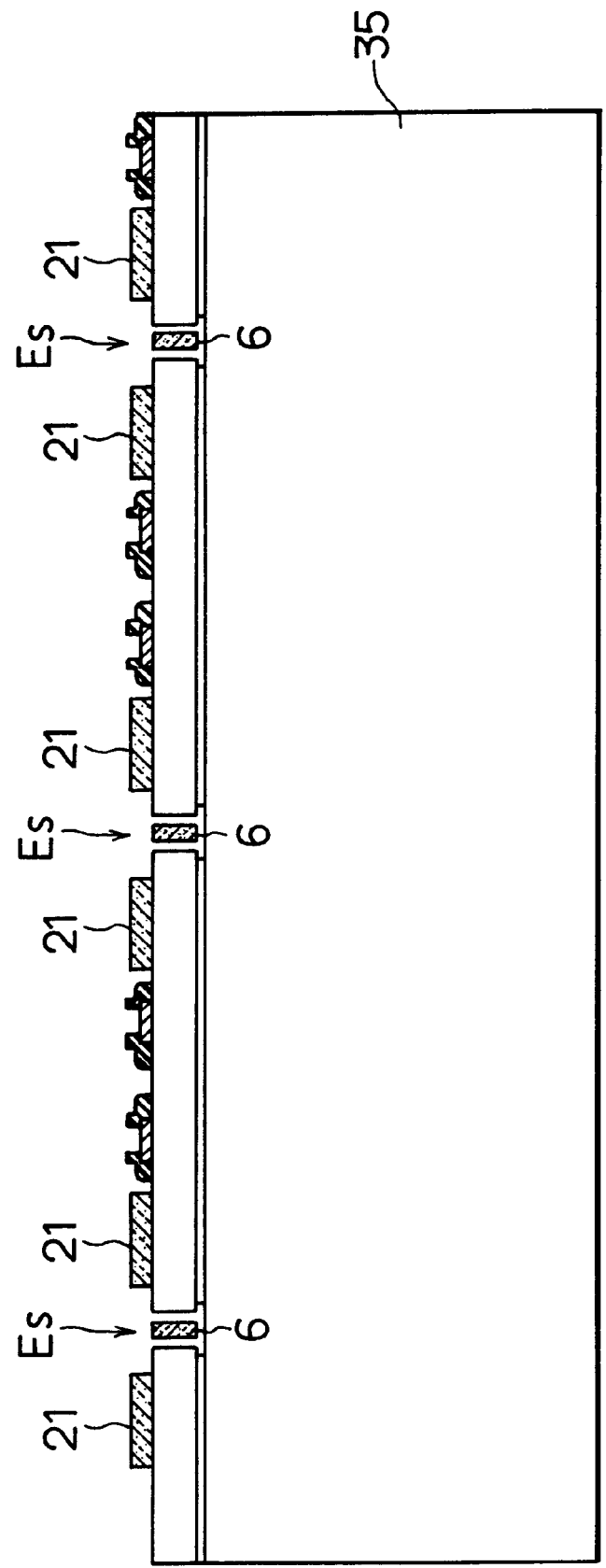

After the resist 37 is removed, as illustrated in FIG. 12, a sacrifice layer surrounding the movable gate electrodes 6 is removed by etching thereby forming the bridged beam structure members that serve as the moving gate electrodes 6. The steps described above referring to FIGS. 10 to 12 will be more specifically explained referring to FIGS. 18 to 22.

Figure 18:
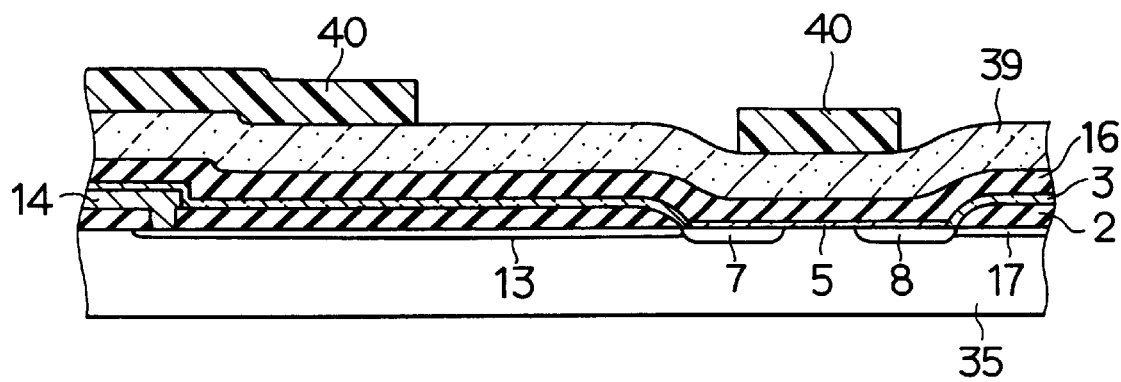
Figure 19:
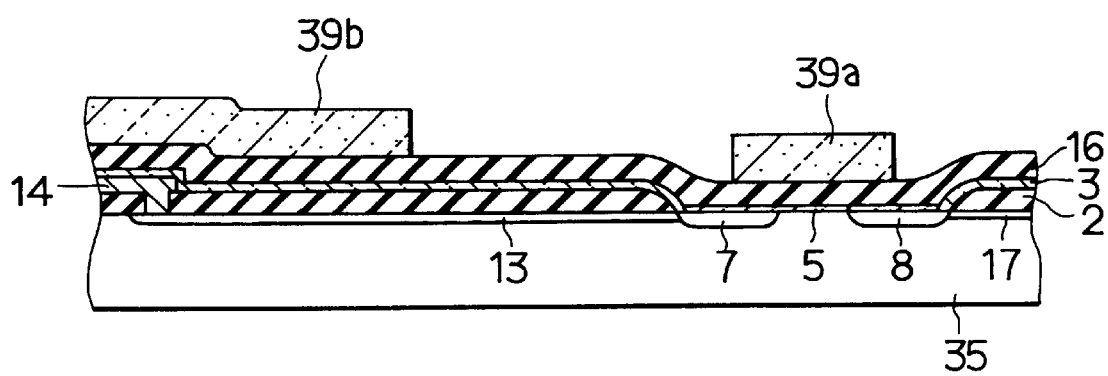

Firstly, as illustrated in FIG. 18, the field oxide layer 2, gate insulation layer 5, impurity diffusion layers (fixed source electrode 7, fixed drain electrode 8, and diffusion regions 9, 13, and 17), draw-out aluminum wiring 14, and the like are formed on the element forming wafer 35 which becomes the silicon substrate 1. A silicon nitride layer 3 that becomes an etching stopper is further formed and patterned. Then, a silicon oxide layer 16 which becomes the sacrifice layer is formed, and then is patterned into a required shape. Further, a polysilicon layer 39 which becomes the movable gate electrode 6 and the Si bonding frame 21 is deposited on the silicon oxide layer 16 and then a photoresist 40 is disposed. Further, as illustrated in FIG. 19, the polysilicon layer 39 is patterned by an ordinary photolithography technique to thereby dispose a polysilicon layer 39a on a movable gate electrode forming region and also dispose a polysilicon layer 39b on an Si bonding frame forming region (region on the surface of the wafer 35 running around the sensing element forming region thereof).

Figure 20:
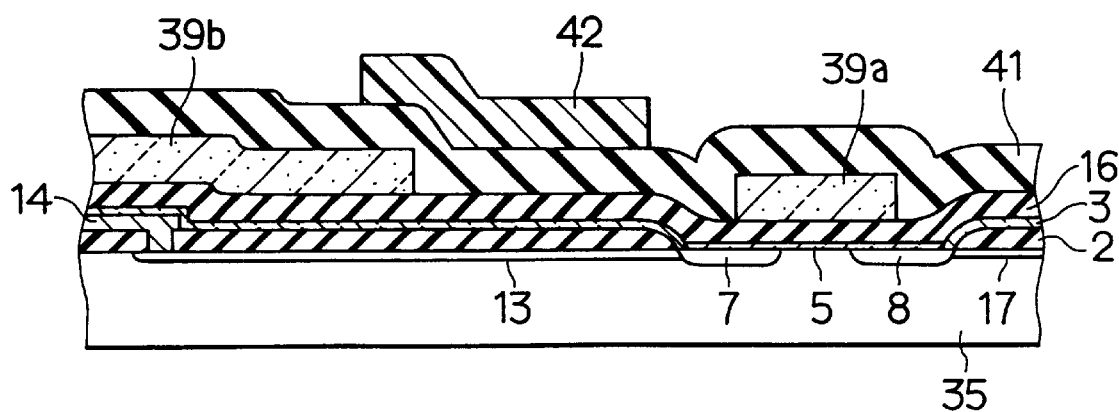
Figure 21:
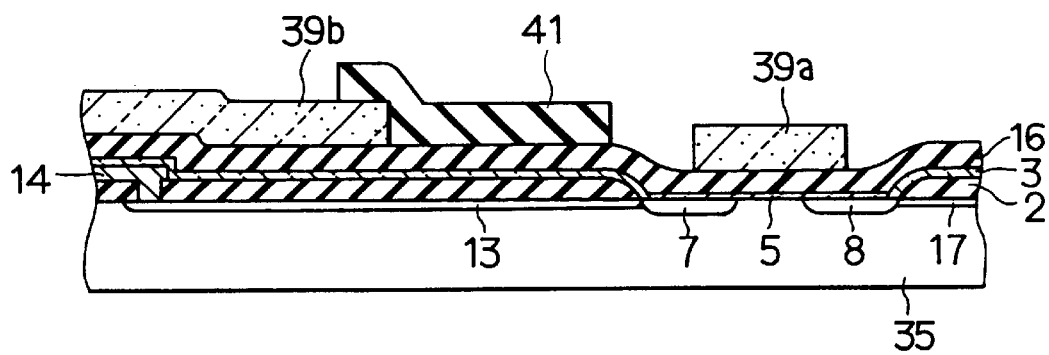

Subsequently, as illustrated in FIG. 20, an insulating layer 41 (e.g., a silicon nitride layer prepared by use of a plasma CVD technique) which becomes a final protection layer for protecting the IC chip is formed on the element forming wafer 35, and it is patterned to protect the regions around the movable gate electrode forming region, and the Si bonding frame forming region. Further, a photoresist 42 is formed on the insulating layer 41. Then, as illustrated in FIG. 21, only the insulating layer 41 located under the photoresist 42 is left by using the photoresist 42 as a mask.

Figure 22:
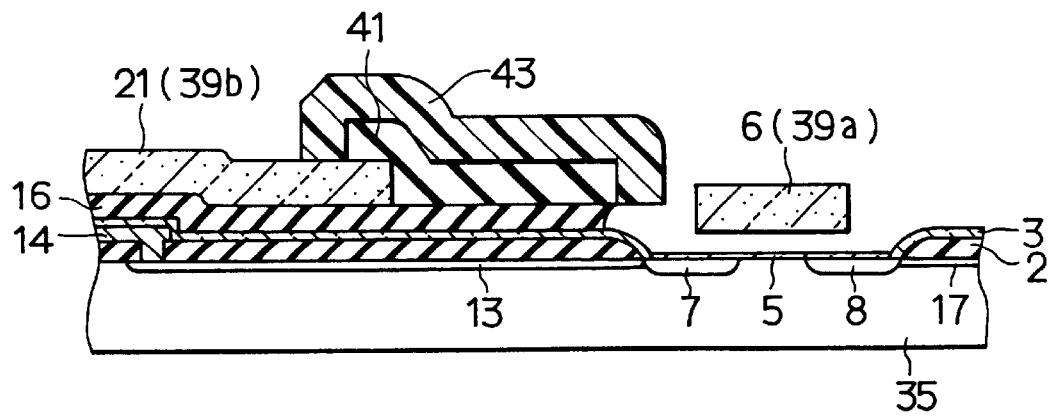

Next, as illustrated in FIG. 22, the silicon oxide layer 16 that serves as the sacrifice layer is etched using a hydrofluoric acid based etching solution and a photoresist 43 functioning as an etching mask to thereby etch only the silicon oxide layer 16 around the polysilicon layer 39a. As a result, the space around the movable gate electrode 6 can be procured. Lastly, the photoresist 43 is removed, whereby the steps for forming the movable gate electrode 6 and the Si bonding frame 21 are completed.

Figure 13:
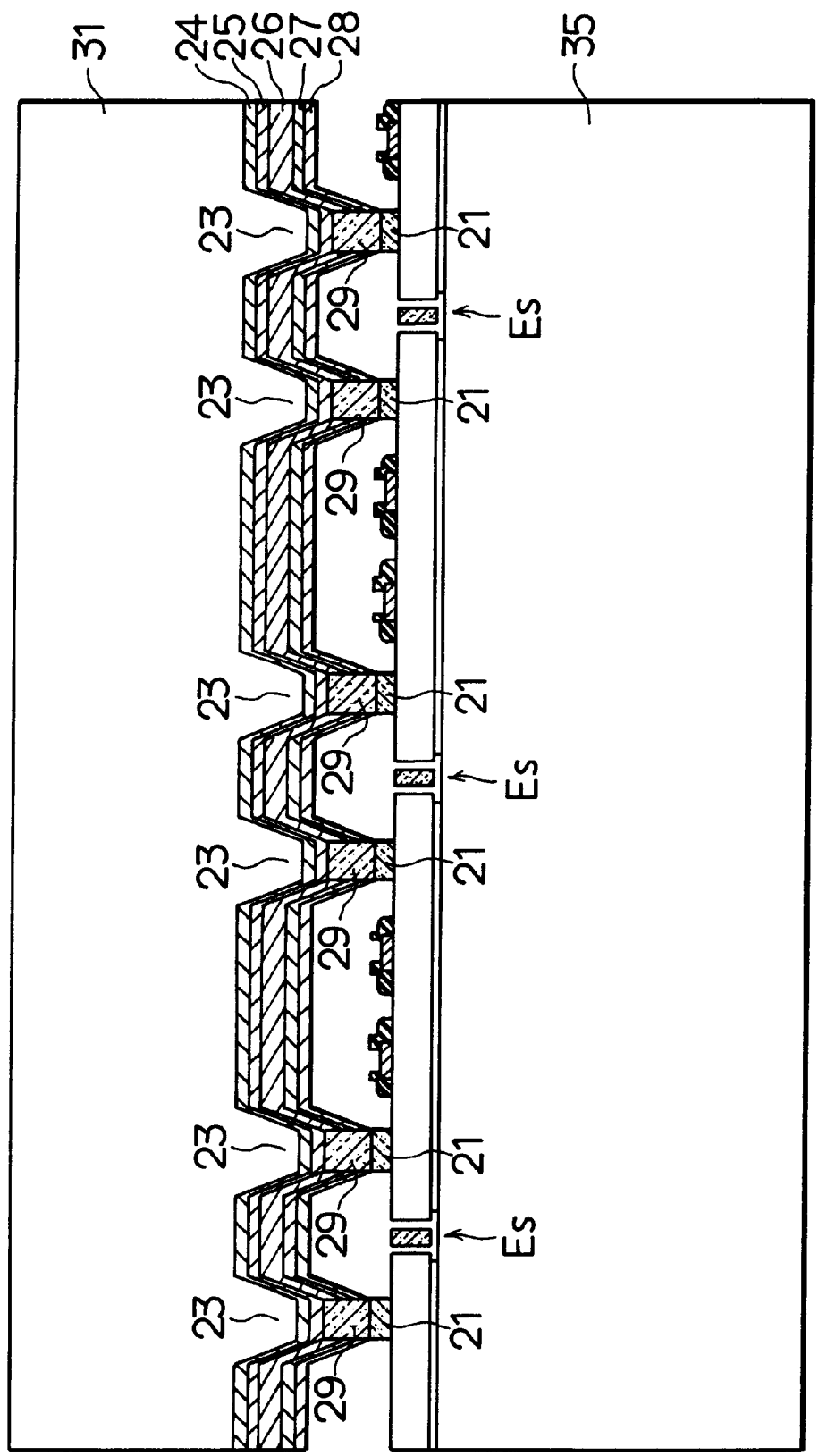
Figure 23:
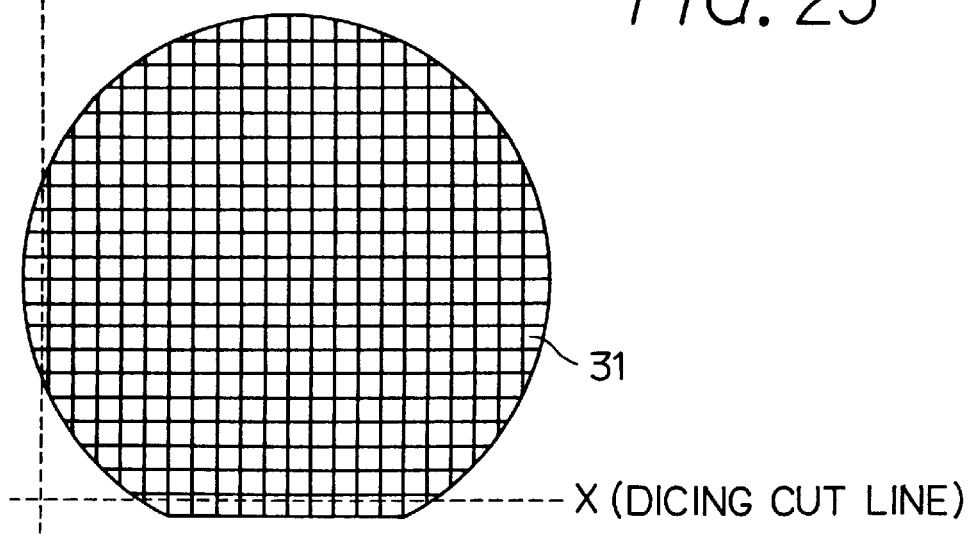
FIG. 23 is a plan view showing a wafer and dicing lines thereof for forming the semiconductor device.

After the steps explained referring to FIGS. 18 to 22 (FIGS. 10 to 12) are performed, the bonding of the cap forming wafer 31 to the element forming wafer 35 and the dicing cut for the wafers are performed. Firstly, as illustrated in FIG. 13, the cap forming wafer 31 having the leg portions 23 formed thereon is positioned on the element forming wafer 35 so that the thin laminated layers 24 to 28 formed on the leg portions 23 are superposed on the Si bonding frame 21. More specifically, the cap forming wafer 31 is positioned on the element forming wafer 35 by using an orientation flat (primary flat) face as a reference. As illustrated in FIG. 23, the wafer 31 is diced along a first group of dicing cut lines which are parallel to an X direction parallel to the orientation flat face, and further diced along a second group of dicing cut lines which are parallel to a Y direction perpendicular to the orientation flat face in the subsequent dicing cut process.

The cap forming wafer 31 and the element forming wafer 35 shown in FIG. 13 are held at 400° C. for 10 minutes in an atmosphere of vacuum, nitrogen ($N_2$), inert gas, or deoxidation agent so as to not oxidize the titanium layer 27, and then is cooled thereby bonding to each other. The applied pressure is 0.8 kgf/mm². Namely, the Si bonding frame (polysilicon layer) 21 and the gold layer 26 are heated up to a temperature higher than an Au/Si eutectic temperature of 363° C. to cause an eutectic reaction therebetween, thereby bonding to each other via the Au/Si eutectic portion 29. The Au/Si eutectic portion 29 is formed on the entire tip surfaces (bottom surfaces) of the leg portions 23 due to titanium (metal which deoxidizes silicon oxide) from the titanium oxide layer 27, and therefore it includes titanium oxide accompanying the deoxidization of the naturally oxidized layer formed on the surface of the Si bonding frame 21. The detailed explanation of this bonding mechanism will be provided below.

Figure 14:
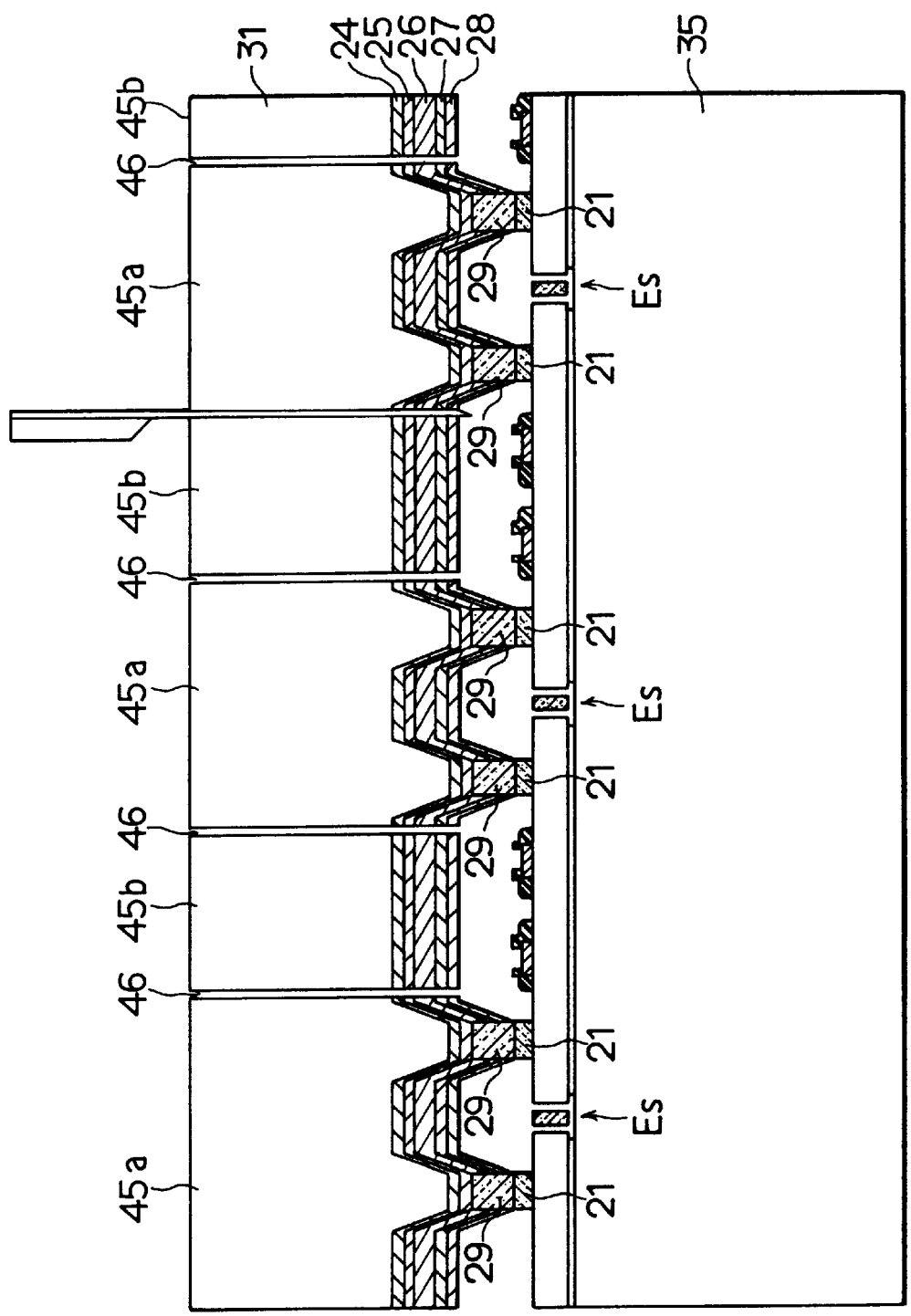

As mentioned above, the cap forming wafer 31 is bonded to the element forming wafer 35 before being diced into respective chips. Then, as illustrated in FIG. 14, cutting the cap forming wafer 31 by the dicing cut process is performed so that cap portions 45a and unnecessary portions 45b are separated from each other. Specifically, the cap forming wafer 31 is cut perpendicularly to the orientation flat face indicated in FIG. 23 (in the Y direction in the drawing) thereby forming cuts 46 shown in FIG. 14.

Figure 15:
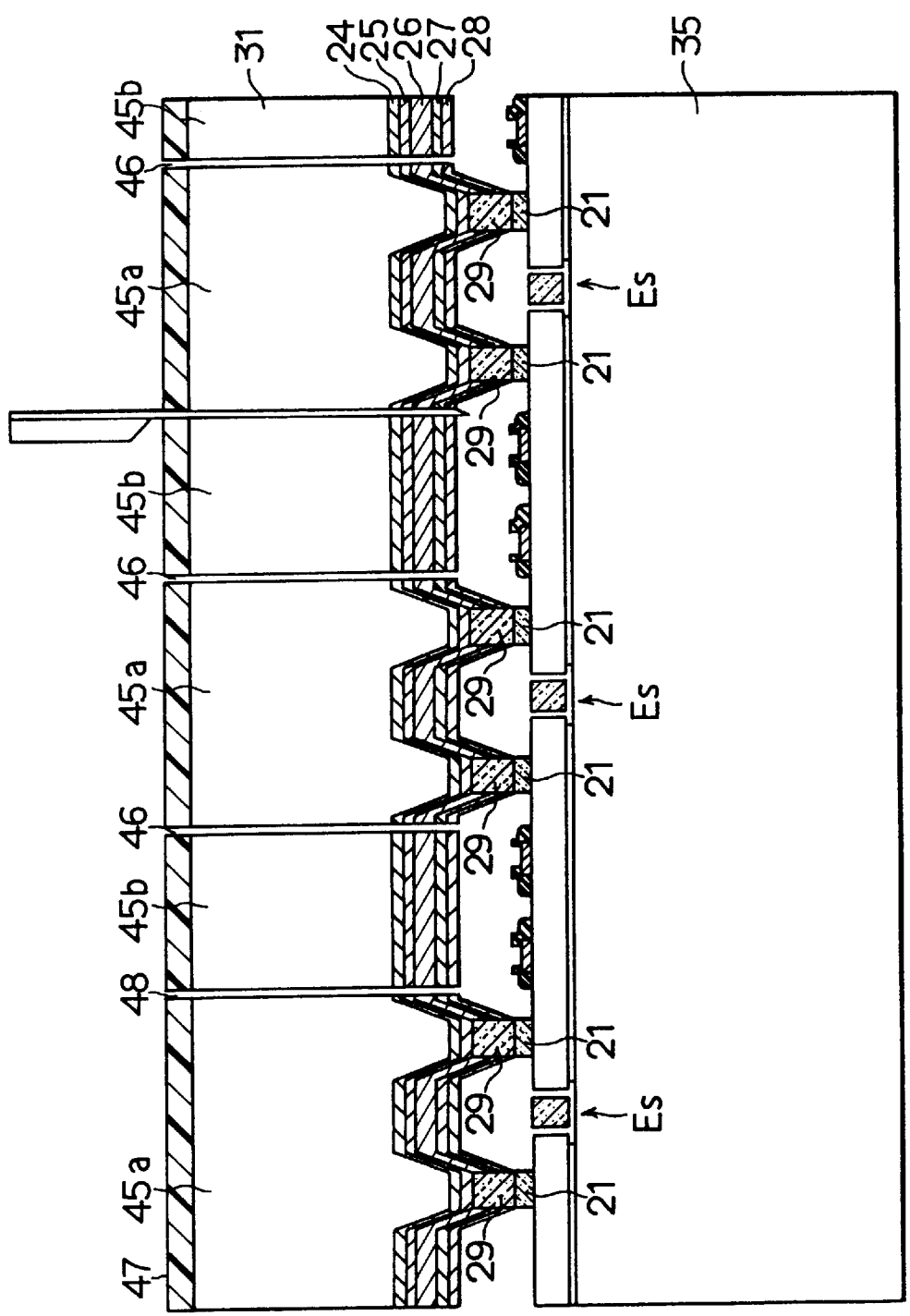
Figure 16:
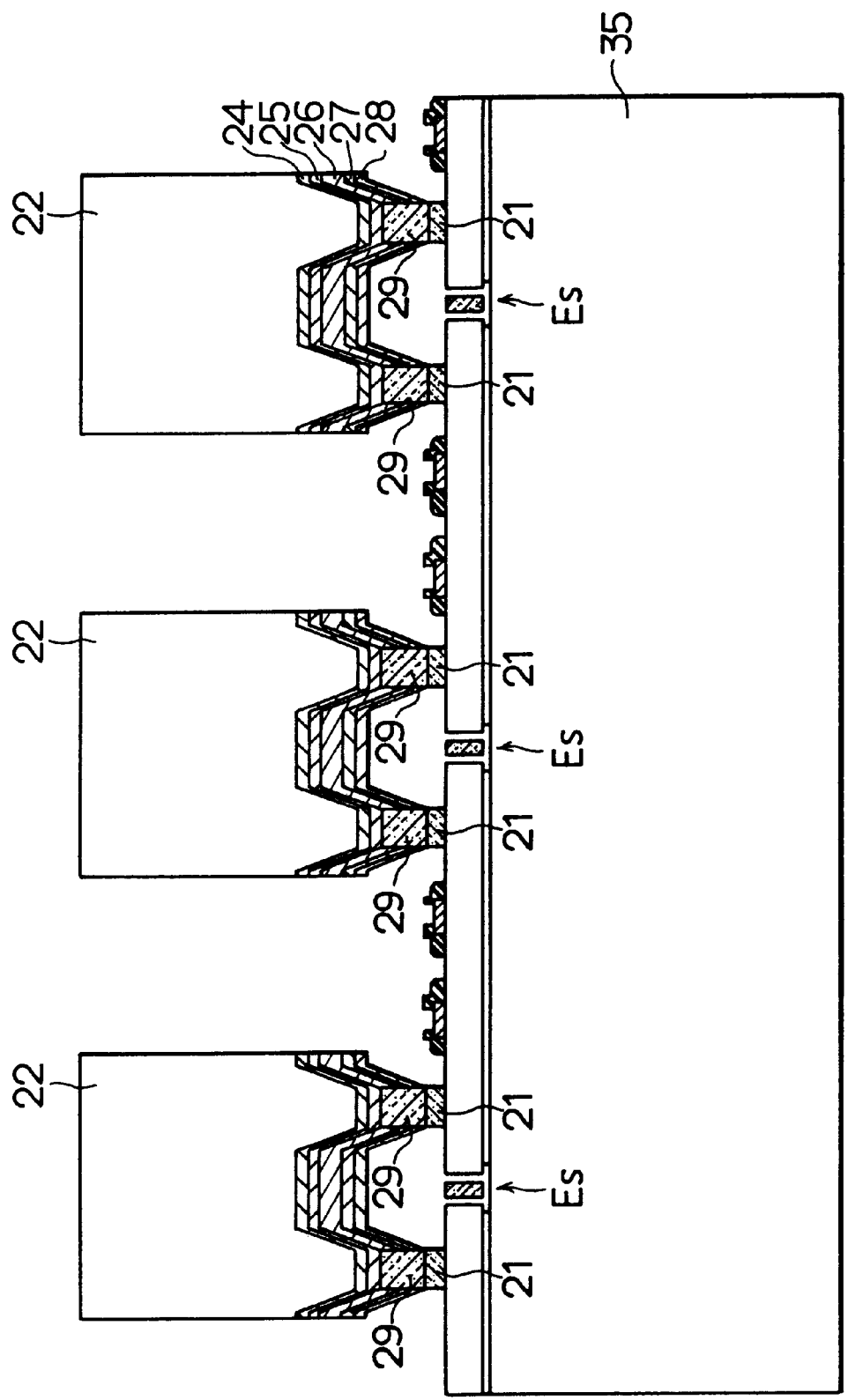

Then, as illustrated in FIG. 15, after an adhesive sheet 47 is attached to the back surface of the cap forming wafer 31, the dicing cut process is additionally performed on the cap forming wafer 31 as well as on the adhesive sheet 47. Accordingly, cuts 48 parallel to the orientation flat face indicated in FIG. 23 (in the X direction in the drawing) are formed. Successively, as illustrated in FIG. 16, the adhesive sheet 47 is pealed off from the thus divided cap forming wafer 31. At that time, the unnecessary portions 45b are removed along with the adhesive sheet 47 thereby forming a structure in which the caps 22 are mounted on the element forming wafer 35.

Figure 17:
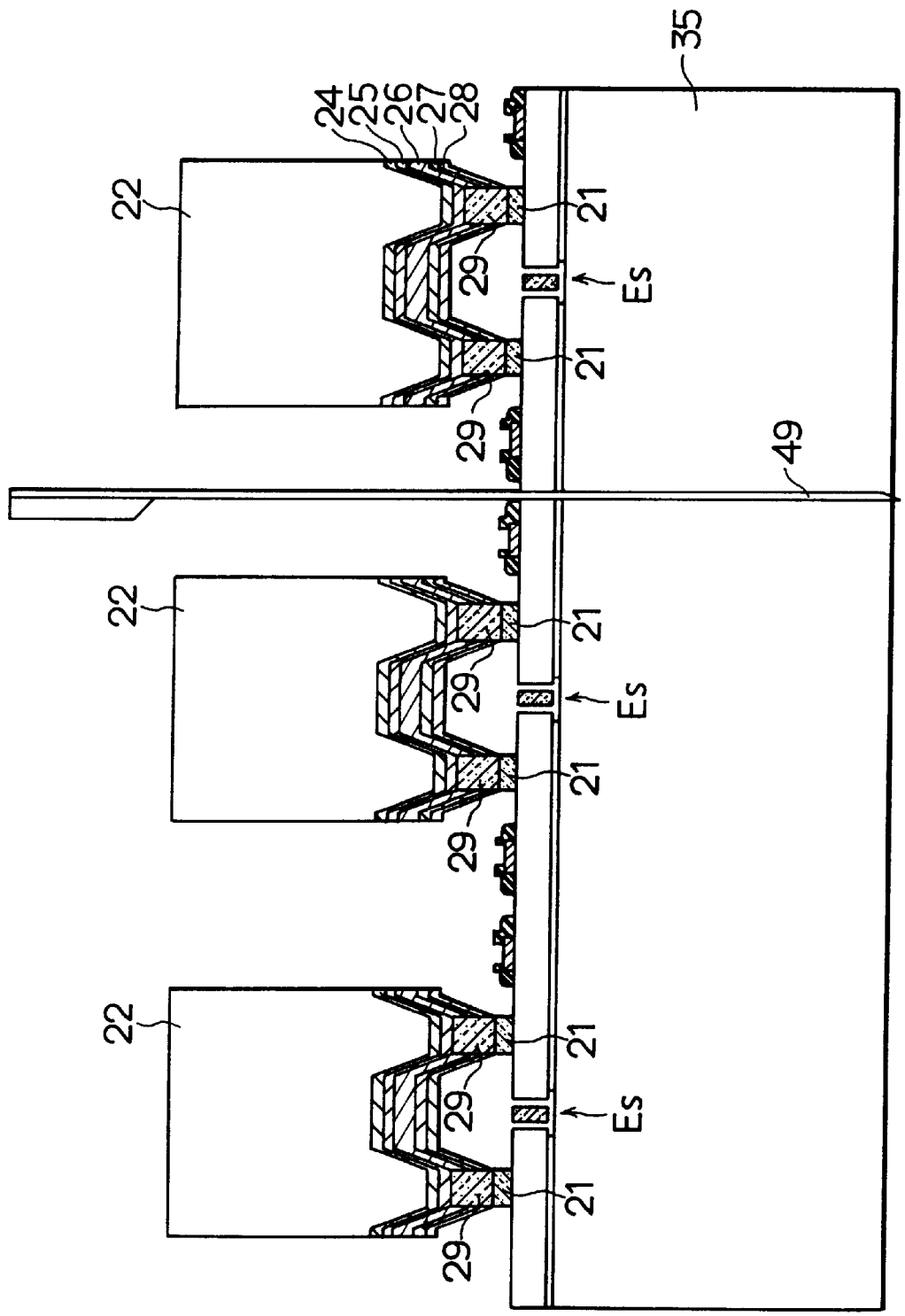

Upon completion of the cutting process and unnecessary portion removing process of the cap forming wafer 31, as illustrated in FIG. 17, the dicing cut process is performed on the element forming wafer 35 along dicing lines corresponding to dicing cut positions 49. As a result, the element forming wafer 35 is divided into the individual sensor chips shown in FIGS. 1 to 3. During this dicing cut process, the cap 22 protects the functional element (sensing element having the bridged beam structure) from hydraulic pressure, a stream of water, and the like applied thereto.

Figure 24:
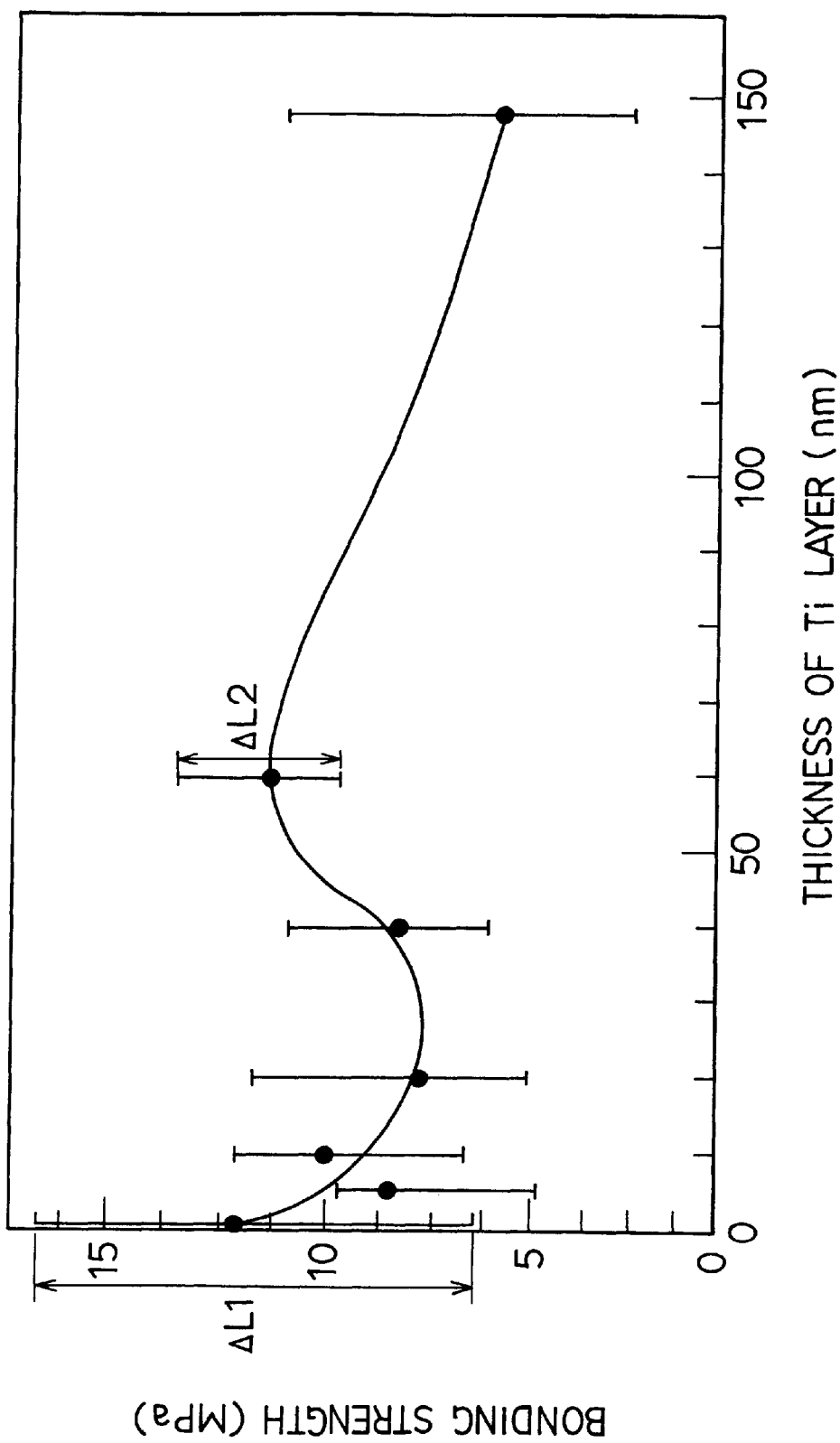
FIG. 24 is a graph showing measurement results of bonding strength of the semiconductor device.

In this way, the semiconductor acceleration sensor indicated in FIGS. 1 to 3 is manufactured. FIG. 24 indicates measurement results of bonding strengths with respect to the thickness of the titanium layer 27 shown in FIG. 2. In a case where the thickness of the titanium layer 27 was 0 nm, that is, the titanium layer 27 was not formed, the bonding strength was in a range of 6.3 MPa to 17.3 MPa and the variations $\Delta L1$ thereof were 11.0 MPa. In a case where the thickness of the titanium layer 27 was 4 nm, the bonding strength was in a range of 4.6 MPa to 9.7 MPa and the variations thereof were 5.1 MPa. Likewise, in a case where the thickness of the titanium layer 27 was 10 nm, the bonding strength was in a range of 6.4 MPa to 12.2 MPa and the variations thereof was 5.8 MPa. In a case where the thickness of the titanium layer was 20 nm, the bonding strength was in a range of 4.8 MPa to 12.0 MPa and the variations thereof were 7.2 MPa. In a case where the thickness of the titanium layer 27 was 40 nm, the bonding strength was in a range of 5.6 MPa to 10.7 MPa and the variations thereof were 5.1 MPa. In a case where the thickness of the titanium layer 27 was 56 nm, the bonding strength was in a range of 10.0 MPa to 14.1 MPa and the variations $\Delta L2$ thereof were 4.1 MPa. In a case where the thickness of the titanium layer 27 was 150 nm, the bonding strength was in a range of 2.4 MPa to 11.1 MPa and the variations thereof were 8.7 MPa.

According to the above-mentioned results, by controlling the thickness of the titanium layer 27 having a deoxidizing property relative to the silicon oxide layer to be in a range of 100 Å to 1000 Å (10 nm to 100 nm), the variations of the bonding strength can be reduced.

Figure 25:
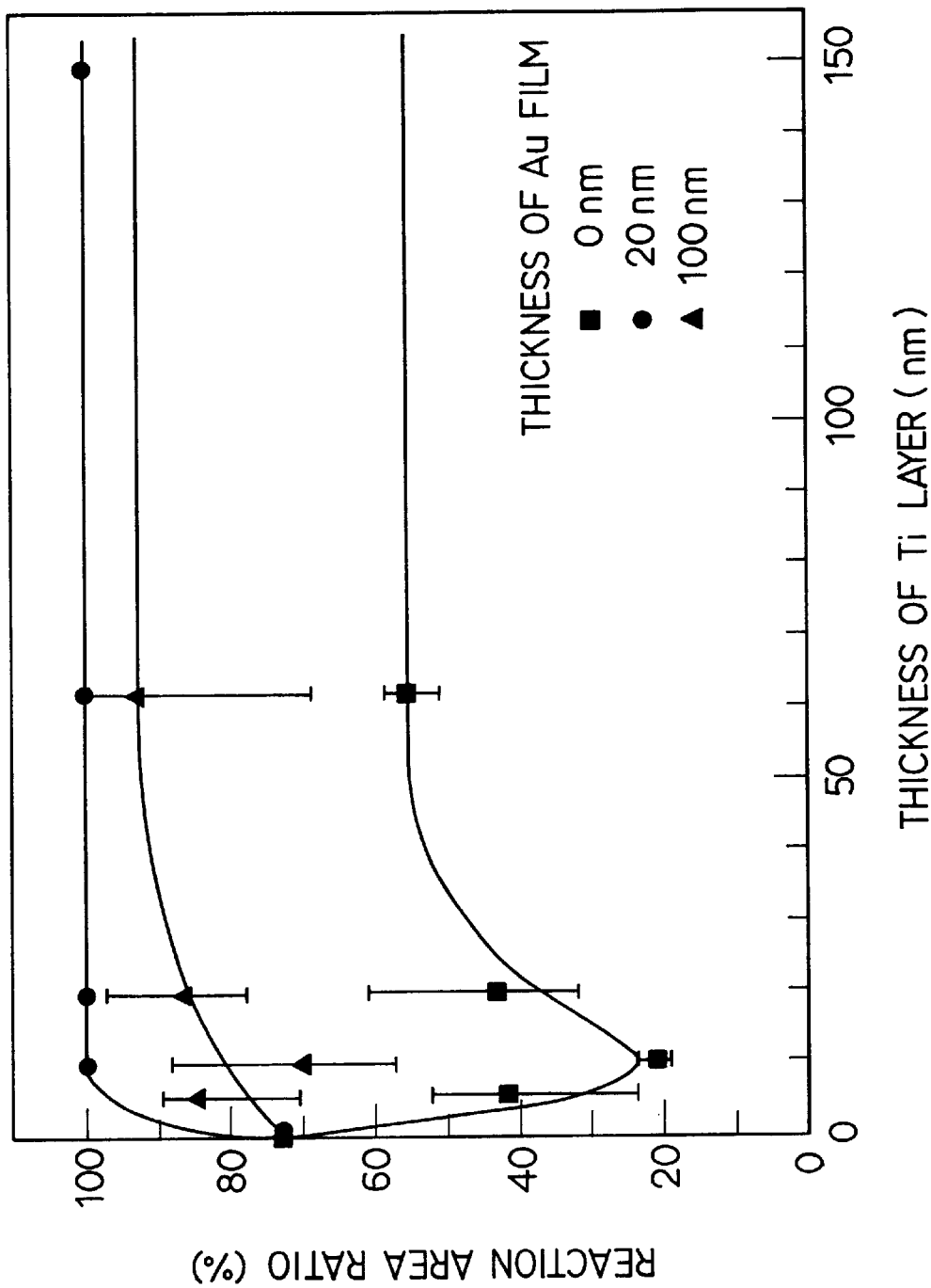
FIG. 25 is a graph showing measurement results of reaction area ratio of the semiconductor device.

FIG. 25 shows measurement results of reaction area ratios with respect to the thickness of the gold layer 28. The reaction area ratio means a ratio of the area where the eutectic reaction occurs relative to an entire contacting area. In FIG. 25, the traversal axis indicates the thicknesses of the titanium layer 27, while the horizontal axis indicates the reaction area ratios. The measurement values in cases where the gold layer 28 is 0 nm, 20 nm, and 100 nm are plotted in FIG. 25. In a case where the thickness of the gold layer 28 is 50 nm, the measurement values are not plotted, however, the values were approximately the same as in the case that the thickness of the gold thin layer 28 was 20 nm.

According to FIG. 25, when the thickness of the gold layer 28 was 20nm, the reaction area ratios were the highest of all. Next thickness of the gold layer 28 having high reaction area ratios was 100 nm. In the case where the thickness of the gold layer 28 was 0 nm, the reaction area ratios were the lowest of all. According to these results, it is confirmed that it is desired to form the gold layer 28 for protecting the titanium layer 27 from the oxidization on the titanium layer 27 to have a thickness of in a range of 200 Å to 500 Å (20 nm to 50 nm).

Figure 27:
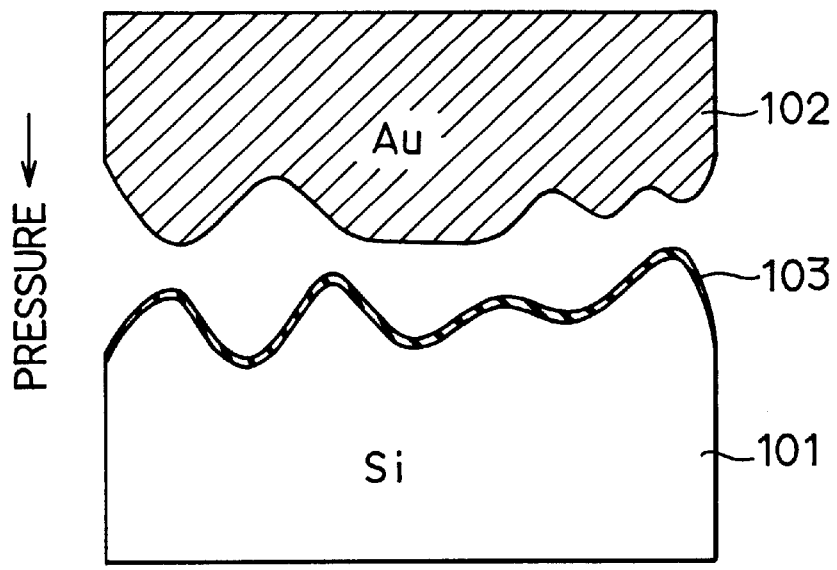
FIGS. 27 to 29 are cross-sectional views for explaining a bonding mechanism of a semiconductor device in which a titanium layer is not employed.
Figure 28:
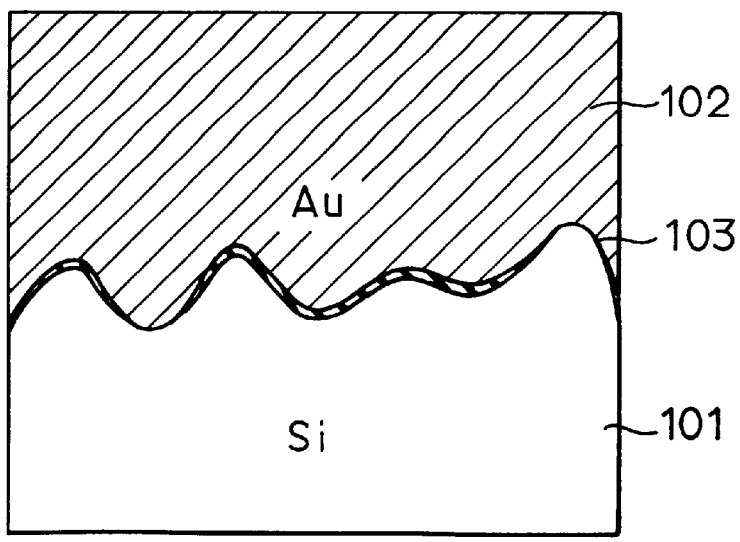
Figure 29:
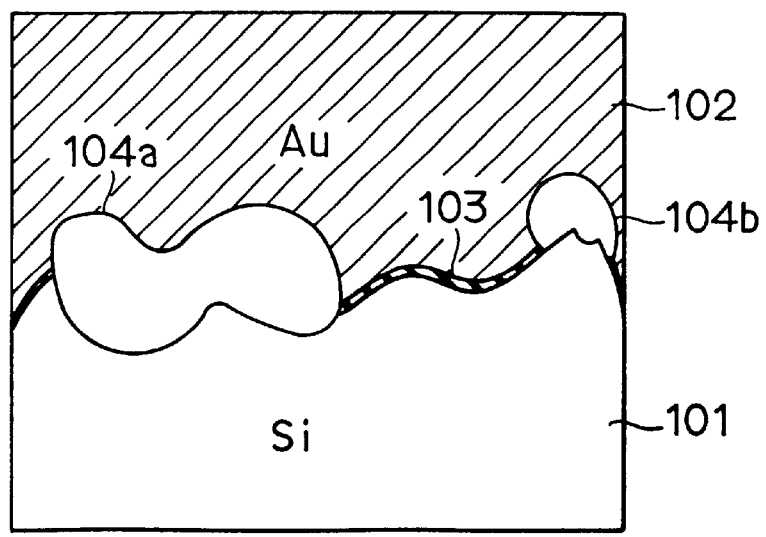

The bonding mechanism of the present invention will be more specifically explained in comparison with another case in which the titanium layer is not formed, referring to FIGS. 27 to 33. Firstly, a bonding mechanism of the case in which the titanium layer is not formed will be explained. Namely, as illustrated in FIG. 27, a silicon portion 101 and a gold layer 102 are bonded to each other without interposing the titanium layer therebetween. The silicon portion 101 and the gold layer 102 generally have a microscopic irregularity on the surfaces thereof, and in addition, a naturally oxidized layer 103 is formed on the silicon portion 101. Accordingly, the silicon portion 101 and the gold layer 102 make point contacts therebetween. Then, as illustrated in FIG. 28, by applying a pressure to the gold layer 102, a part of the naturally oxidized layer 103 is broken and convex portions (or concave portions) of the silicon portion 101 are fitted to concave portions (or convex portions) of the gold layer 102. Further, by heating up to a temperature higher than the Au/Si eutectic temperature, as illustrated in FIG. 29, eutectic regions 104a and 104b are formed on the interface between the silicon portion 101 and the gold layer 102 thereby bonding the silicon portion 101 and the gold layer 102 together. At this time, however, the contact between the silicon portion 101 and the gold layer 102 is interrupted by the existence of the naturally oxidized layer 103, whereby the eutectic regions 104a and 104b are formed at only a part of the interface between the silicon portion 101 and the gold layer 102. Specifically, the eutectic regions are formed at only the regions where the naturally oxidized layer 103 is broken.

Figure 30:
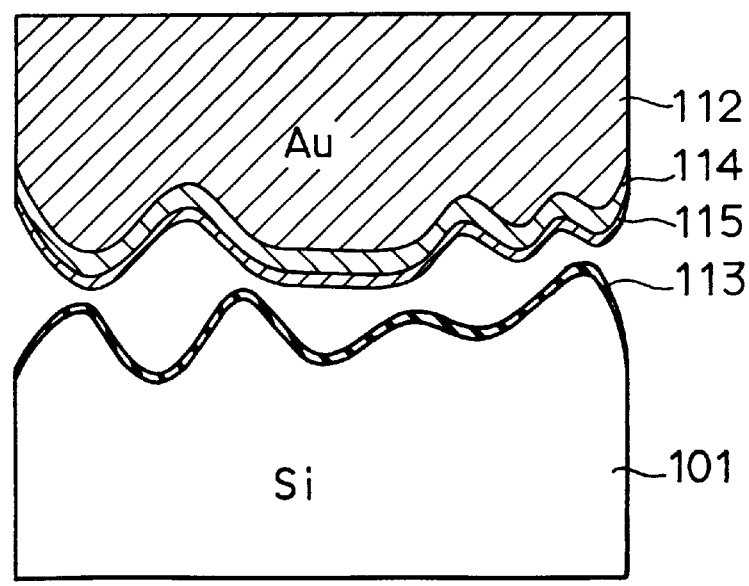
FIGS. 30 to 33 are cross-sectional views for explaining a bonding mechanism of the semiconductor device according to the present invention, in which the titanium layer is employed.
Figure 31:
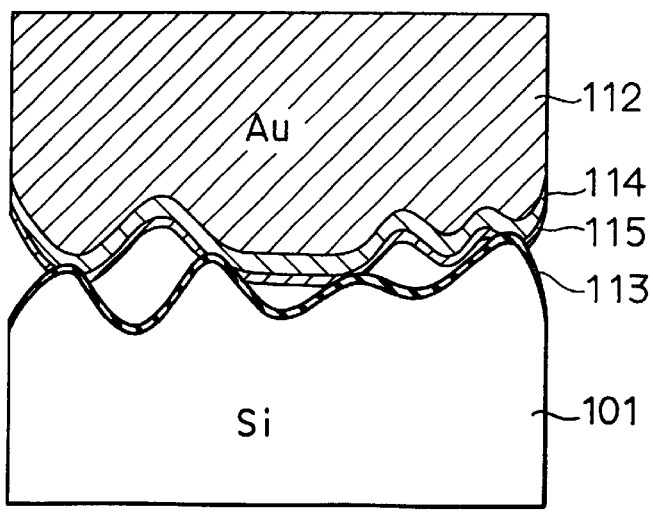
Figure 32:
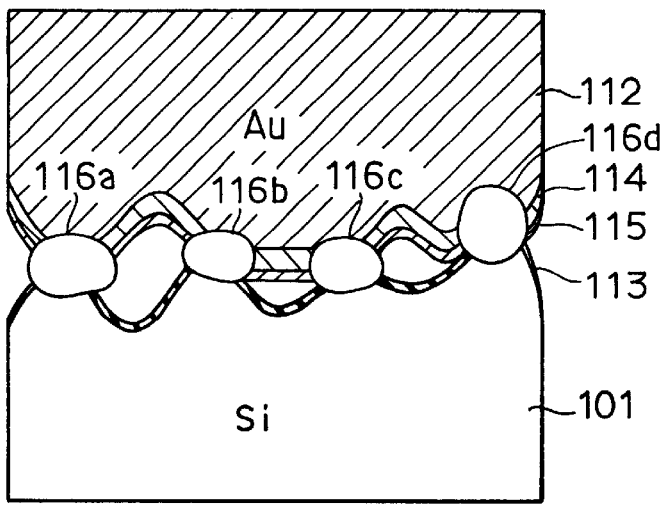
Figure 33:
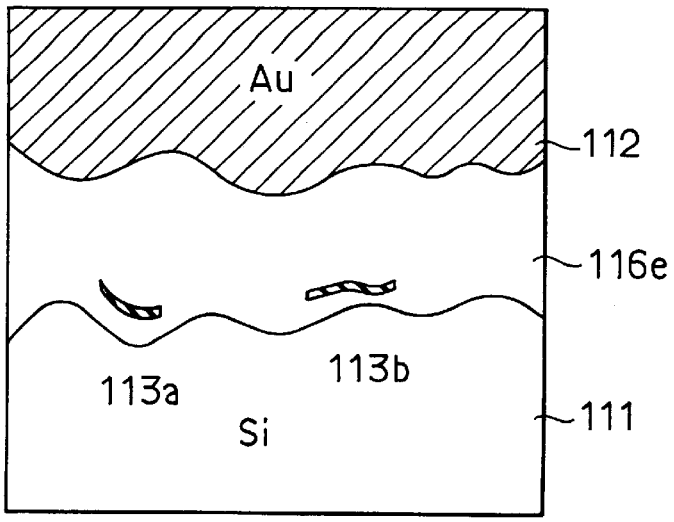

On the other hand, the bonding in the present invention is performed on the basis of the following mechanism. As illustrated in FIG. 30, a silicon portion 111 and a gold layer 112 which are to be bonded together also have a microscopic irregularity on the surfaces thereof, and a naturally oxidized layer 113 is formed on the surface of the silicon portion 111 as well. Further, in the present invention, a titanium layer 114 is formed on the gold layer 112, and a gold layer 115 is formed on the titanium layer 114 to prevent the oxidization of the titanium layer 114. In this state, as illustrated in FIG. 31, the surface of the silicon portion 111 and the surface of the gold layer 112 make point-contacts therebetween with the titanium layer 114 and the gold layer 115 interposed therebetween. Then, by heating up to the temperature higher than the Au/Si eutectic temperature, as illustrated in FIG. 32, eutectic regions 116a, 116b, 116c, and 116d are formed at a part of the interface between the silicon portion 111 and the gold layer 112. By additional heating, as illustrated in FIG. 33, an eutectic region 116e is formed on an entire area of the interface between the silicon portion 111 and the gold layer 112. During this heating, the naturally oxidized layer 113 is deoxidized by titanium diffused from the titanium layer 114 through the gold layer 115 thereby producing silicon. As a result, the silicon portion 111 directly contacts the gold layer 112 at the entire area of the interface thereof whereby the eutectic region 116 is formed at the entire area. Titanium from the titanium layer 114 is oxidized to be titanium oxide, and the titanium oxide remains in the eutectic region 116.

In this way, the silicon portion 111 and the gold layer are bonded together. The barrier function of the naturally oxidized layer 113 is eliminated by the titanium layer 114 formed on the gold layer 112, whereby the silicon portion 111 and the gold layer 112 can be contacted to each other on the entire area. As a result, the occurrence of the voids in the bonding portion can be prevented and the variations of bonding strength due to the naturally oxidized layer is reduced, thereby resulting in a stable and uniform bonding interface. Accordingly, the semiconductor device can be manufactured by this bonding process with a high yield.

While the present invention has been shown and described with reference to the foregoing preferred embodiment, it will be apparent to those skilled in the art that changes in form and detail may be made therein without departing from the scope of the invention as defined in the appended claims.

For example, in the above-mentioned embodiment, the titanium layer 27 is employed to realize a void-less bonding, however, other metallic layers such as aluminum (Al), tantalum (Ta), zirconium (Zr), niobium (Ni) layers and the like which deoxidize the silicon oxide layer may be employed. In this case, likewise it is preferable to perform the bonding process in the atmosphere of vacuum, inert gas, or deoxidization agent.

The surface treatment (roughening treatment) prior to the bonding of wafers may be executed by etching using a silicon etching solution (an alkaline solution) in place of the sputtering using Ar. Further, concerning the order cutting the wafers, the element forming wafer 35 may be cut in advance of the cutting of the cap forming wafer 31. Furthermore, the Si bonding frame 21 may consist of a single-crystal silicon layer, an amorphous silicon layer, or a single-crystal silicon bulk in place of the polysilicon layer. Especially, in the case where the single-crystal silicon layer is employed as the bonding silicon, the effect of performing the roughening treatment on the surface of the silicon layer becomes large.

The material for forming the cap forming wafer 31 can be selected from glass, ceramics, resin, and the like in addition to the silicon. The present invention can be applied to not only the semiconductor acceleration sensor but other semiconductor devices having movable portions (vibrating portions) provided on silicon chips such as a microdiaphragm pressure sensor, a yaw rate sensor, and the like. In addition, the present invention can be applied to devices having contacts or the like, and also to other bonding techniques for surface mounting (e.g., flip chip bonding) and the like.

Variations such as those described above are to be understood as being within the scope of the present invention as defined by the appended claims.

What is claimed is:

1. A semiconductor device comprising:

a first substrate having a surface portion made of silicon;

a second substrate bonded to the first substrate;

an eutectic portion of silicon and gold interposed between the first and second substrates to directly contact the surface portion of the first substrate at a first surface thereof and containing an oxide of metal that has deoxidized silicon oxide, the oxide of metal existing in the eutectic portion apart from the first substrate; and a gold layer interposed between the eutectic portion and the second substrate and directly contacting a second surface of the eutectic portion on an opposite side of the first substrate.

2. A semiconductor device according to claim 1, wherein the metal is at least one selected from a group consisting of titanium, aluminum, tantalum, zirconium, and niobium.

3. A semiconductor device according to claim 1, wherein a functional element formed on the first substrate is sealed within a gap between the first and second substrates.

4. A semiconductor device according to claim 1, wherein the silicon oxide deoxidized by the metal is a oxidized layer that is arranged on the surface portion of the first substrate.

5. A semiconductor device according to claim 1, wherein:

the first substrate is bonded to the second substrate only at the surface portion thereof; and the eutectic portion directly contacts the entire surface portion.

6. A semiconductor device according to claim 1, wherein the first substrate and the second substrate are bonded to each other only through a non-insulating part including the eutectic portion and the gold layer.

7. A semiconductor device according to claim 4, wherein the first substrate and the second substrate are bonded to each other permanently through the eutectic portion.

* * * * *